(12) United States Patent
Zhang et al.

(10) Patent No.: US 12,256,508 B2
(45) Date of Patent: Mar. 18, 2025

(54) PIVOTABLE SUPPORT APPARATUS AND DISPLAY APPARATUS

(71) Applicant: BOE Technology Group Co., Ltd., Beijing (CN)

(72) Inventors: Shouchuan Zhang, Beijing (CN); Shangchieh Chu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/788,595

(22) PCT Filed: Sep. 27, 2021

(86) PCT No.: PCT/CN2021/120993
§ 371 (c)(1),
(2) Date: Jun. 23, 2022

(87) PCT Pub. No.: WO2023/044910
PCT Pub. Date: Mar. 30, 2023

(65) Prior Publication Data
US 2024/0215182 A1    Jun. 27, 2024

(51) Int. Cl.
*H05K 5/00* (2006.01)
*G06F 1/16* (2006.01)
*H05K 5/02* (2006.01)

(52) U.S. Cl.
CPC ......... *H05K 5/0226* (2013.01); *G06F 1/1624* (2013.01); *G06F 1/1641* (2013.01); *G06F 1/1681* (2013.01)

(58) Field of Classification Search
None
See application file for complete search history.

(56) References Cited

U.S. PATENT DOCUMENTS 10,480,227 B1    11/2019   Chen et al.
10,551,880 B1 *   2/2020   Ai ........................ G06F 1/1641
(Continued)

FOREIGN PATENT DOCUMENTS

CN    208673636 U    3/2019
CN    109887417 A    6/2019
(Continued)

OTHER PUBLICATIONS

International Search Report & Written Opinion mailed Feb. 25, 2022, regarding PCT/CN202021/120993.
(Continued)

*Primary Examiner* — Anthony Q Edwards
*Assistant Examiner* — Rashen E Morrison
(74) *Attorney, Agent, or Firm* — Intellectual Valley Law, P.C.

(57) ABSTRACT

A pivotable support apparatus for supporting a foldable display panel is provided. The pivotable support apparatus includes a sliding groove structure; a first rotating rod and a second rotating rod slidably and rotatably attached to the sliding groove structure; a first rotating plate; a second rotating plate; a first connecting rod rotatably attached to the first rotating rod, and configured to move slidably relative to the first rotating plate; and a second connecting rod rotatably attached to the second rotating rod, and configured to move slidably relative to the second rotating plate.

19 Claims, 24 Drawing Sheets

(56) References Cited

U.S. PATENT DOCUMENTS

| | | | |
|---|---|---|---|
| 11,596,074 B2* | 2/2023 | Park ................... | H05K 5/0226 |
| 11,644,874 B2* | 5/2023 | Kuramochi .......... | H04M 1/022 |
| | | | 361/679.27 |
| 11,825,620 B2* | 11/2023 | Zhao ................... | H05K 5/0226 |
| 11,886,254 B2* | 1/2024 | Kim .................... | G06F 1/1641 |
| 11,917,780 B2* | 2/2024 | Caplow-Munro ... | H05K 5/0226 |
| 11,924,987 B2* | 3/2024 | Lee ..................... | G06F 1/16 |
| 11,994,161 B2* | 5/2024 | Liu ..................... | H05K 5/0226 |
| 2020/0103935 A1* | 4/2020 | Hsu .................... | G06F 1/1681 |
| 2020/0267851 A1 | 8/2020 | Hou et al. | |
| 2020/0375046 A1 | 11/2020 | Sim et al. | |
| 2021/0271294 A1 | 9/2021 | Liao et al. | |

FOREIGN PATENT DOCUMENTS

| | | |
|---|---|---|
| CN | 209070886 U | 7/2019 |
| CN | 111833725 A | 10/2020 |
| CN | 212003929 U | 11/2020 |
| CN | 112449525 A | 3/2021 |
| CN | 213176454 U | 5/2021 |
| GB | 1371906 A | 10/1974 |
| TW | 202105341 A | 2/2021 |

OTHER PUBLICATIONS

Extended European Search Report in the European Patent Application No. 21958028.9, dated Jul. 15, 2024.

* cited by examiner

PIVOTABLE SUPPORT APPARATUS AND DISPLAY APPARATUS

CROSS-REFERENCE TO RELATED APPLICATION

This application is a national stage application under 35 U.S.C. § 371 of International Application No. PCT/CN2021/120993, filed Sep. 27, 2021, the contents of which are incorporated by reference in the entirety.

TECHNICAL FIELD

The present invention relates to display technology, more particularly, to a pivotable support apparatus and a display apparatus.

BACKGROUND

Portable display devices such as foldable and flexible display devices have become a focus of research and development in display technology in recent years. A flexible display device is a bendable or deformable display device having a flexible display panel. Examples of flexible display devices include a flexible organic light emitting display (OLED) device, a flexible electrophoretic display (EPD) device, and a flexible liquid crystal display (LCD) device. As a new generation display device, the flexible display device is thinner and tighter, having high contrast, high responsiveness, and high brightness. It also provides full color and a wide viewing angle. The flexible display device has found a wide range of applications is mobiles phones, personal digital assistance (PDAs), digital cameras, on-board displays, notebook computers, on-wall televisions, as well as various military applications. A flexible display device includes a flexible array substrate. A base substrate of the flexible array substrate can be made of flexible material such as plastic.

SUMMARY

In one aspect, the present disclosure provides a pivotable support apparatus for supporting a foldable display panel, comprising a sliding groove structure; a first rotating rod and a second rotating rod slidably and rotatably attached to the sliding groove structure; a first rotating plate; a second rotating plate; a first connecting rod rotatably attached to the first rotating rod, and configured to move slidably relative to the first rotating plate; and a second connecting rod rotatably attached to the second rotating rod, and configured to move slidably relative to the second rotating plate.

Optionally, the sliding groove structure comprises a first are shaped groove and a second are shaped groove; the first rotating rod comprises a first are shaped rod head configured to be movable slidably and rotatably in the first are shaped groove; and the second rotating rod comprises a second are shaped rod head configured to be movable slidably and rotatably in the second arc shaped groove.

Optionally, the sliding groove structure comprises a first part and a second part fixedly attached to each other to form a first are shaped groove and a second are shaped groove; the first part comprises a first are shaped concave surface and a second are shaped concave surface; the first are shaped rod head comprises a first are shaped convex surface at least partially in contact with the first are shaped concave surface; and the second are shaped rod bead comprises a second are shaped convex surface at least partially in contact with the second are shaped concave surface.

Optionally, the pivotable support apparatus further comprises a cladding board; wherein the first part is fixedly attached to the cladding board.

Optionally, the pivotable support apparatus further comprises a first retaining plate and a second retaining plate; a first sliding slot between the first retaining plate and the first rotating plate, configured to allow the first connecting rod move slidably therein; and a second sliding slot between the second retaining plate and the second rotating plate, configured to allow the second connecting rod move slidably therein.

Optionally, the first retaining plate is fixedly attached to the first rotating plate; and the second retaining plate is fixedly attached to the second rotating plate.

Optionally, the pivotable support apparatus further comprises a first frame and a second frame; wherein the first connecting rod is fixedly attached to the first frame; and the second connecting rod is fixedly attached to the second frame; wherein the first frame and the first connecting rod are configured to move slidably relative to the first rotating plate; and the second frame and the second connecting rod are configured to move slidably relative to the second rotating plate.

Optionally, the pivotable support apparatus further comprises a first actuating rod and a second actuating rod; wherein the first rotating plate is fixedly attached to the first actuating rod; and the second rotating plate is fixedly attached to the second actuating rod.

Optionally, the pivotable support apparatus further comprises a first crank shaft attached into a first pin hole is the first actuating rod and a second crank shaft attached into a second pin hole in the second actuating rod; wherein the first crank shaft and the first actuating rod are configured to rotate together; and the second crank shaft and the second actuating rod are configured to rotate together.

Optionally, the pivotable support apparatus further comprises a damping slider configured to be resiliently pressing on the first crank shaft and the second crank shaft, providing damping resistance when the first crack shaft and the first actuating rod rotate relative to the second craw shaft and the second actuating rod.

Optionally, the first crank shaft comprises a first cam bar, the second crank shaft comprises a second cam bar; the damping slider comprises a first notch, a second notch, a third notch, and a fourth notch; in an unfolded state of the pivotable support apparatus, the first cam bar is configured to be engaged with the first notch, and the second cam bar is configured to be engaged with the second notch; and in a folded state of the pivotable support apparatus, the first cam bar is configured to be engaged with the third notch, and the second cam bar is configured to be engaged with the fourth notch.

Optionally, the damping slider further comprises a first groove positioned between the first notch and the third notch, and a second groove positioned between the second watch and the fourth watch; and during a movement between the folded state and the unfolded state of the pivotable support apparatus, the first cam bar is in contact with and gliding on s surface of the first groove, the second cam bar is in contact with and gliding on a surface of the second groove, thereby damping the movement of the pivotable support apparatus.

Optionally, the pivotable support apparatus further comprises one or more springs configured to apply a force to the damping slider to maintain the damping slider in contact with the first cam bar and the second cam bar.

Optionally, the damping slider further comprises one or more spring shafts extending through the one or more springs, respectively; and the pivotable support apparatus further comprises a fastener comprising one or more receiving holes configured to receive terminals of the one or more spring shafts, respectively.

Optionally, the pivotable support apparatus further comprises a binge structure comprising a first main shaft and a second main shaft; and a synchronized gear configured to synchronize rotation of the first main shaft and the second main shaft; wherein the synchronized gear comprises a first gear and a second gear configured to rotate about the first main shaft and the second main shaft, respectively; and the first gear and the second gear are configured to be engaged with each other.

Optionally, the pivotable support apparatus further comprises a first actuating rod, a first crank shaft attached to the first actuating rod, a second actuating rod, and a second crank shaft attached to the second actuating rod; wherein the first crank shaft comprises a third gear configured to be engaged with the first gear; the second crank shaft comprises a fourth gear configured to be engaged with the second gear; and movements of the first actuating rod, the first crank shaft, the second actuating rod, the second crank shaft are synchronized through engagement among the first gear, the second gear, the third gear, and the fourth gear.

Optionally, the pivotable support apparatus further comprises a sliding plate fastener; a first actuating rod; a second actuating rod; a first sliding plate slidably attached to the first actuating rod; and a second sliding plate slidably attached to the second actuating rod; wherein the first sliding plate and the second sliding plate are fixedly attached to the sliding plate fastener; and wherein in a folded state of the pivotable support apparatus, a first included angle between the first sliding plate and the second sliding plate is greater than a second included angle between the first actuating rod and the second actuating rod.

Optionally, the first actuating rod comprises a first groove; the second actuating rod comprises a second groove; the first sliding plate comprises a first shaft configured to be received in the first groove, allowing the first sliding plate move slidably relative to the first actuating rod; and the second sliding plate comprises a second shaft configured to be received in the second groove, allowing the second sliding plate move slidably relative to the second actuating rod.

Optionally, the first groove comprises a first sub-groove and a second sub-groove connected with sack offer; the second groove comprises a third sub-groove and a fourth sub-groove connected with each other; extension directions of the first sub-groove and the second sub-groove are at an included angle less than 180 degrees and greater than 0 degree; extension directions of the third sub-groove and the fourth sub-groove are at an included angle less than 180 degrees and greater than 0 degree; and in a folded state of the pivotable support apparatus, the first shaft is configured to be received in the second sub-groove, the second shaft is configured to be received in the fourth sub-grove.

Optionally, the sliding plate fastener comprises a first fastening pin hole and a second fastening pin bole; the first sliding plate comprises a third shaft configured to be engaged with the first fastening pin hole; and the second sliding plate comprises a fourth shaft configured to be engaged with the second fastening pin hole.

In another aspect, the present disclosure provides a display apparatus, comprising a foldable display panel and a pivotable support apparatus described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a pivotable support apparatus and a display apparatus that substantially obviate one or more of the problems due to limitations and disadvantages of the related art. In one aspect, the present disclosure provides a pivotable support apparatus for supporting a foldable display panel. In some embodiments, the pivotable support apparatus includes a sliding groove structure; a first rotating rod and a second rotating rod slidably and rotatably attached to the sliding groove structure; a first rotating plate; a second rotating plate; a first connecting rod rotatably attached to the first rotating rod, and configured to move slidably relative to the first rotating plate; and a second connecting rod rotatably attached to the second rotating rod, and configured to move slidably relative to the second rotating plate.

Figure 1:
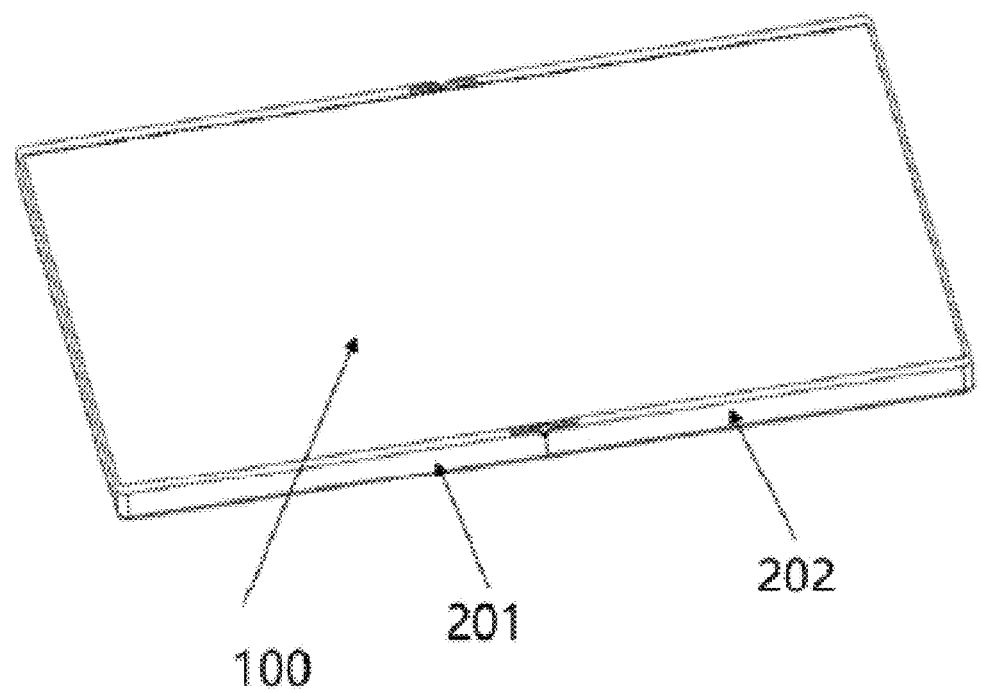
FIG. 1 is a perspective view of a pivotable support apparatus in an unfolded state and a foldable display panel supported thereon in some embodiments according to the present disclosure.
Figure 2:
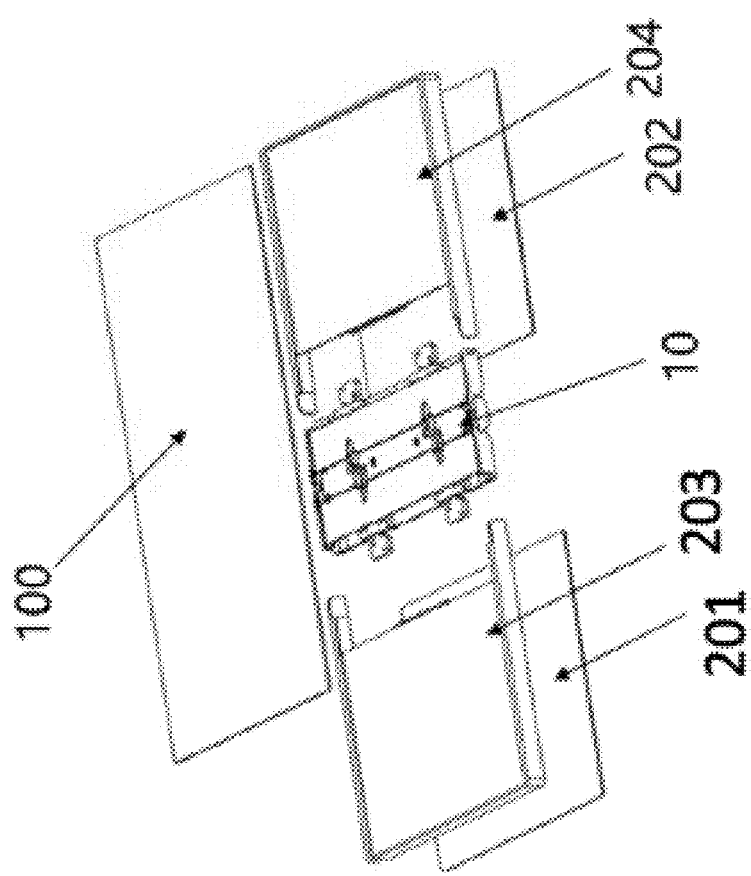
FIG. 2 is an exploded view of a pivotable support apparatus in an unfolded state and a foldable display panel supported thereon in some embodiments according to the present disclosure.
Figure 3:
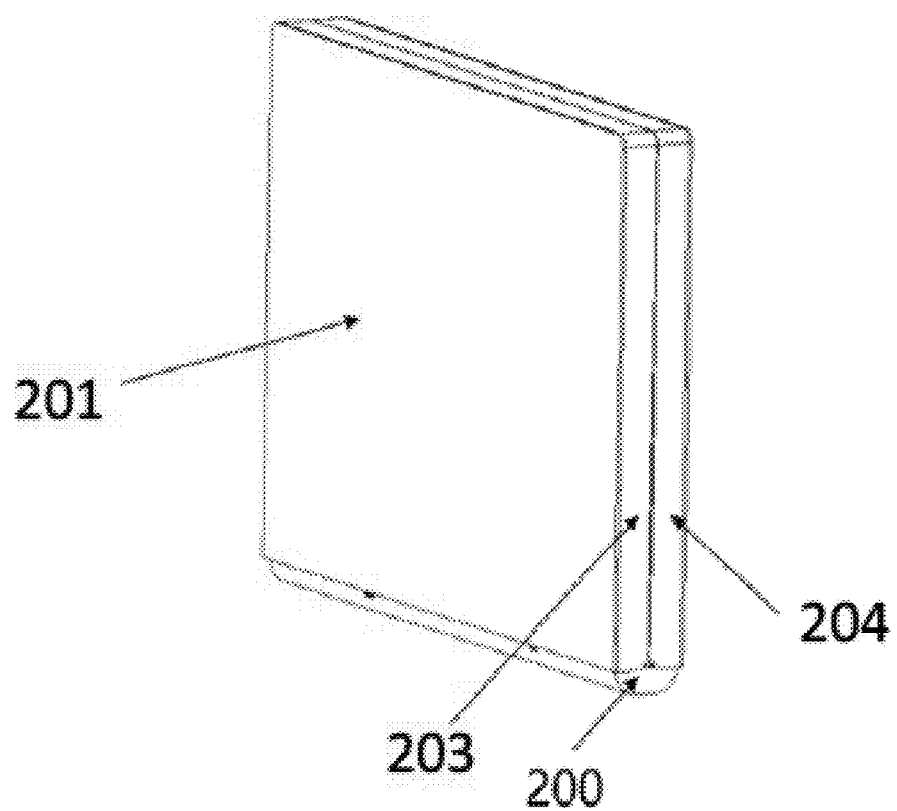
FIG. 3 is a perspective view of a pivotable support apparatus in a folded state in some embodiments according to the present disclosure.

FIG. 1 is a perspective view of a pivotable support apparatus in an unfolded state and a foldable display panel supported thereon in some embodiments according to the present disclosure. FIG. 2 is an exploded view of a pivotable support apparatus in an unfolded state and a foldable display panel supported thereon in some embodiments according to the present disclose. FIG. 3 is a perspective view of a pivotable support apparatus in a folded state in some embodiments according to the present disclosure. Referring to FIG. 1 to FIG. 3, the pivotable support apparatus in some embodiments includes a hinge structure 10; and a first frame 203 and a second frame 204 connected to the binge structure 10, and configured to support a foldable display panel 100 placed thereon. Optionally, the pivotable support apparatus farther includes a first back cover 201 and a second back cover 202 covering back sides of the first frame 203 and the second frame 204, respectively. The first back cover 201 and the second back cover 202 are on a side of the first frame 203 and the second frame 204 away from the foldable display panel 100. As shown in FIG. 1 and FIG. 2, a foldable display panel 100 may be supported on front sides of the first frame 203 and the second frame 204. As shown in FIG. 3, the pivotable support apparatus in some embodiments further includes a cladding board 200 for covering various components of the pivotable support apparatus.

Figure 4A:
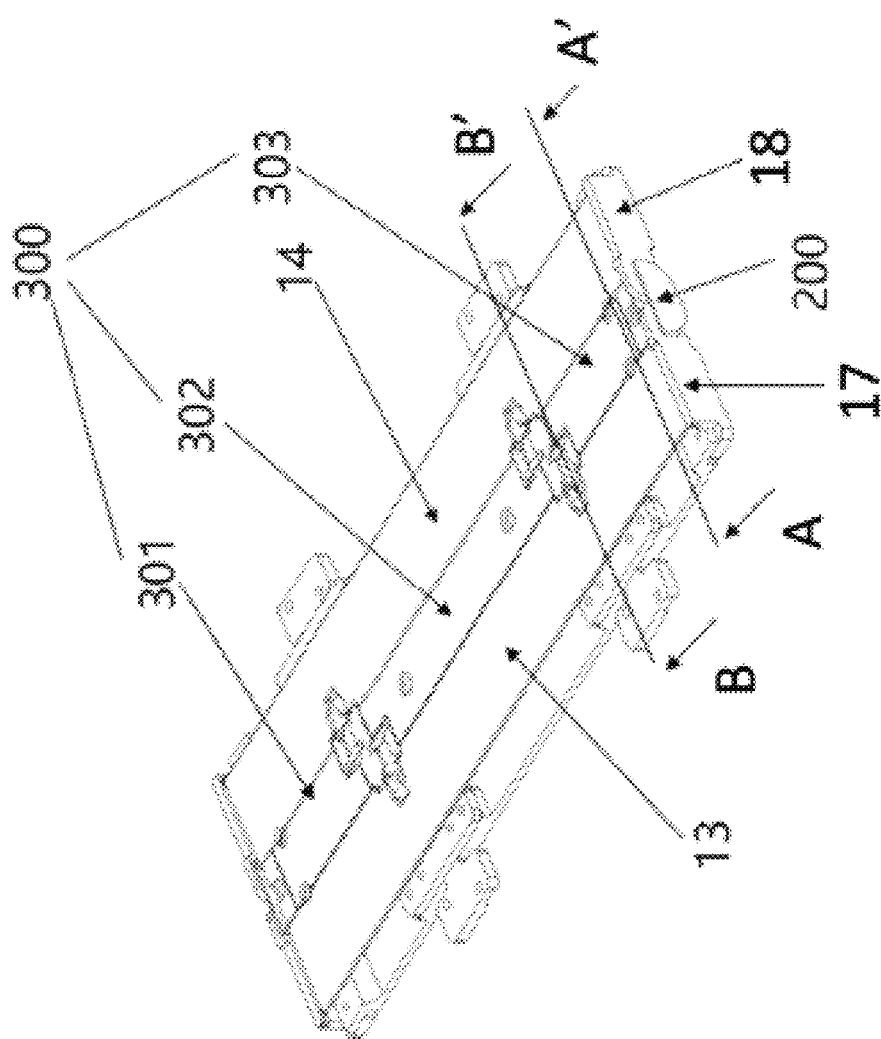
FIG. 4A is a perspective view of a hinge assembly in a pivotable support apparatus in as unfolded state in some embodiments according to the present disclosure.
Figure 4B:
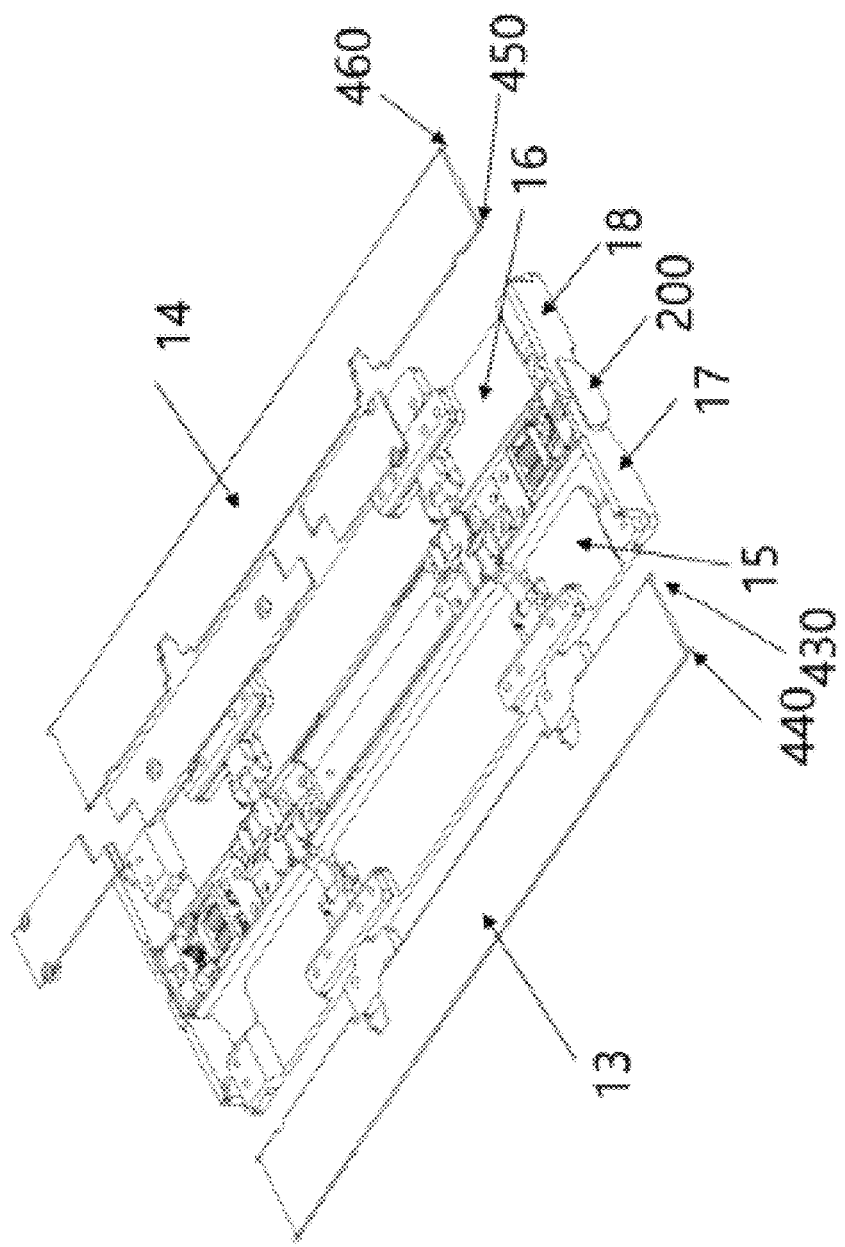
FIG. 4B is an exploded view of a hinge assembly in a pivotable support apparatus in as unfolded state in some embodiments according to the present disclosure.
Figure 5:
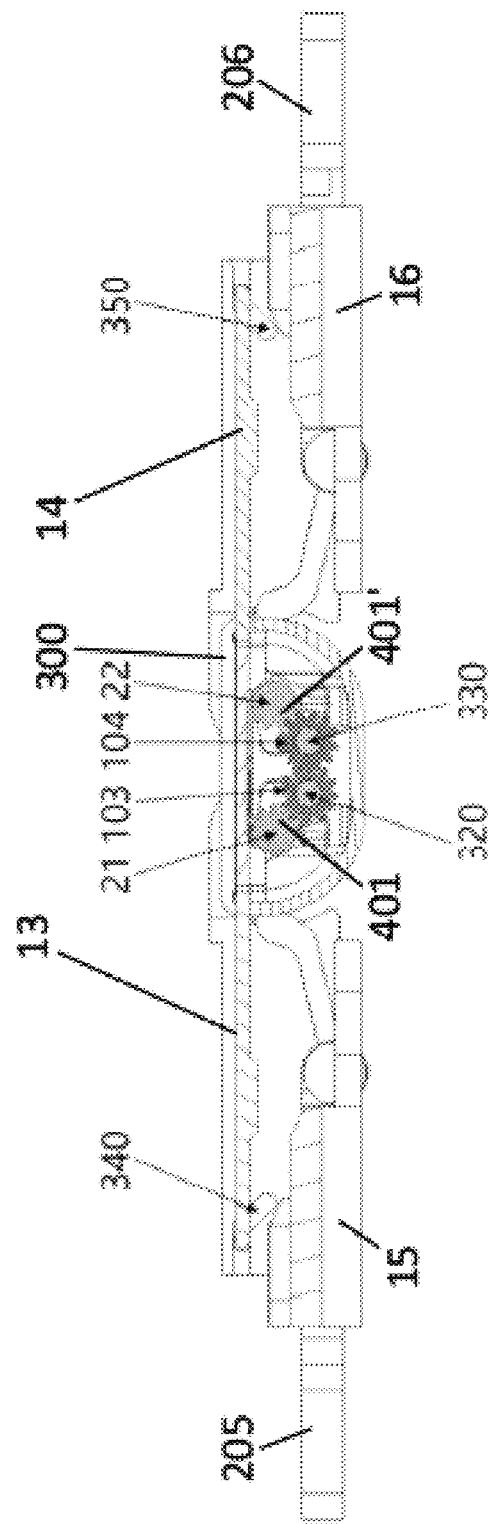
FIG. 5 is a cross-sectional side view of a pivotable support apparatus in an unfolded state in some embodiments according to the present disclosure.
Figure 6:
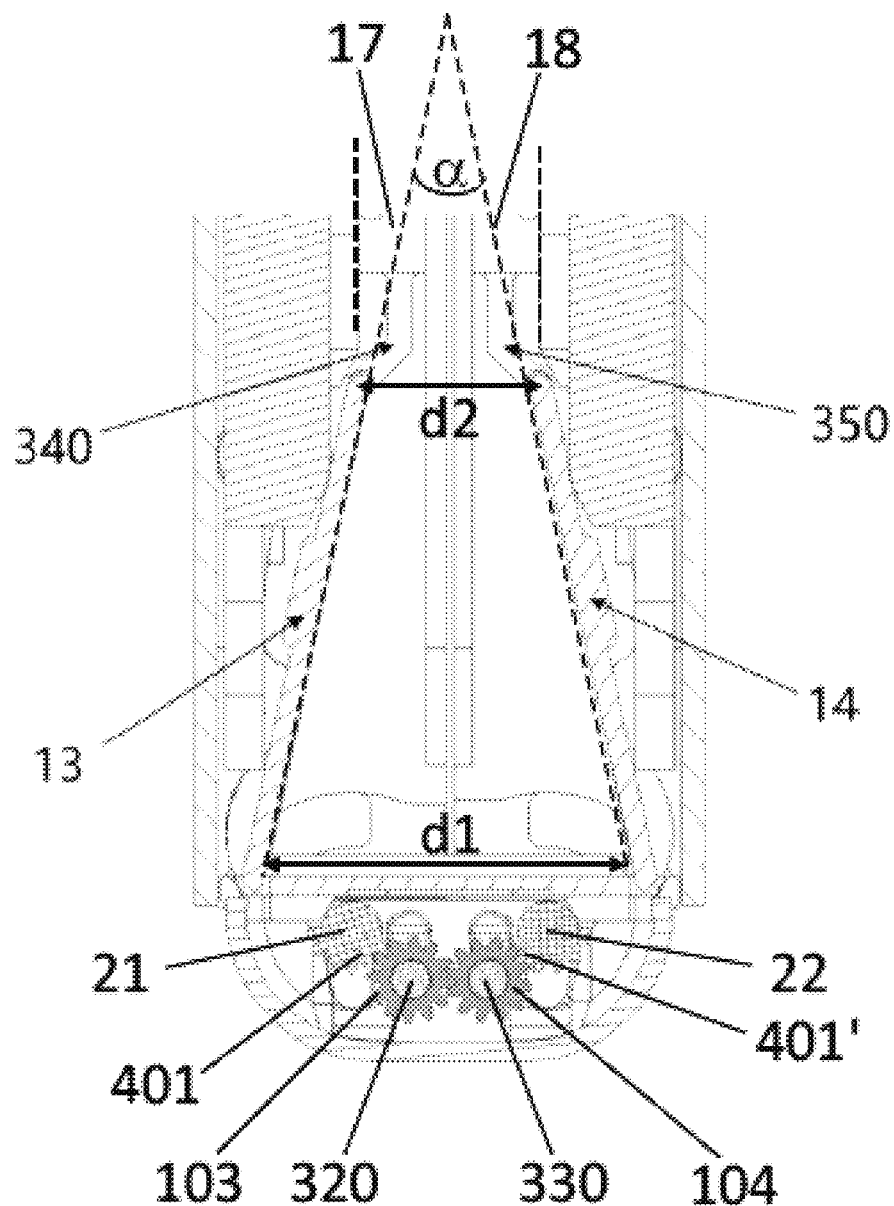
FIG. 6 is a cross-sectional side view of a pivotable support apparatus in a folded state in some embodiments according to the present disclosure.
Figure 7:
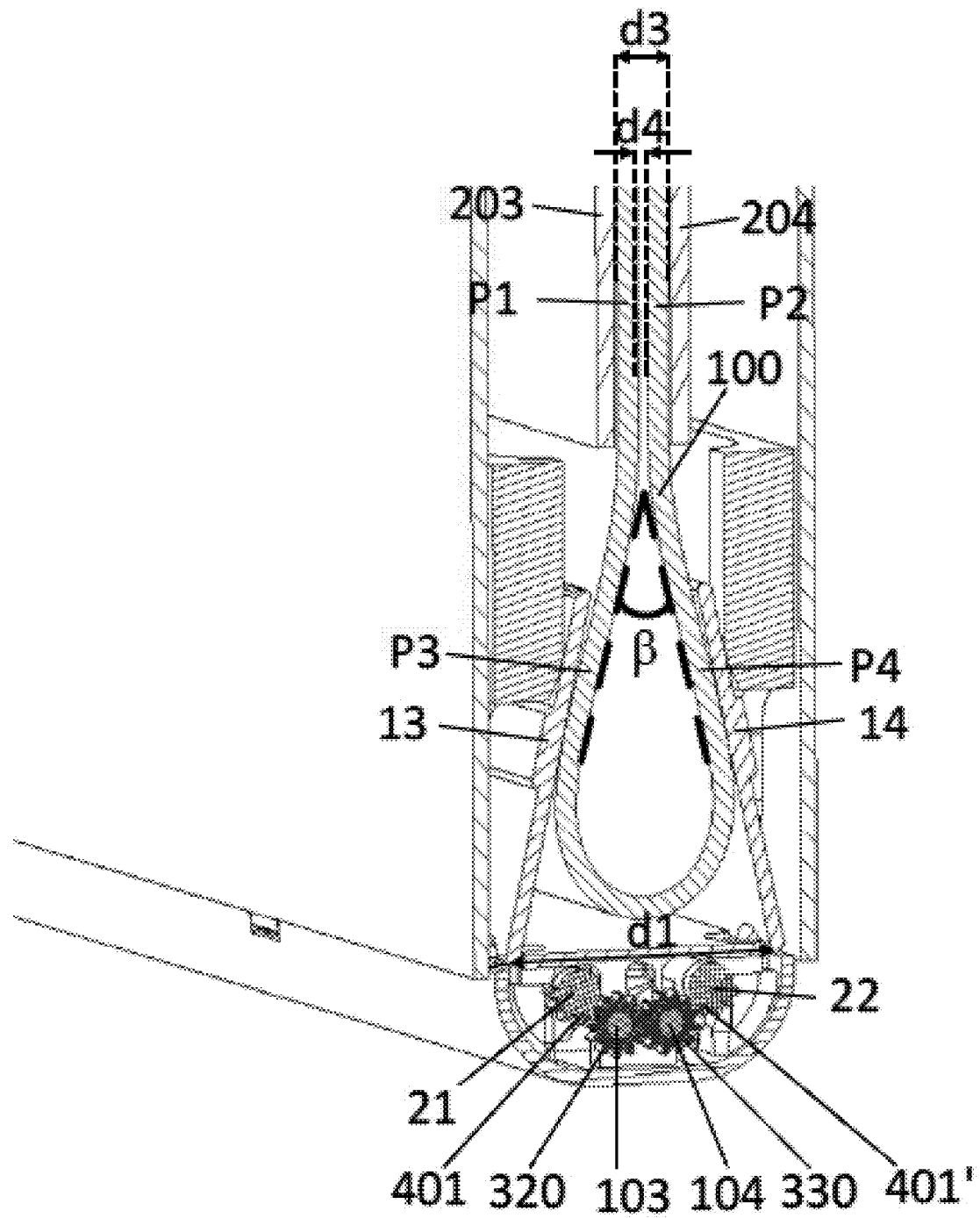
FIG. 7 is a perspective view of a display apparatus having a pivotable support apparatus in a folded state in some embodiments according to the present disclosure.

FIG. 4A is a perspective view of a hinge assembly in a pivotable support apparatus is an unfolded state in some embodiments according to the present disclosure. FIG. 4B is an exploded view of a binge assembly in a pivotable support apparatus in an unfolded state in some embodiments according to the present disclosure. FIG. 5 is a cross-sectional side view of a hinge assembly in a pivotable support apparatus in an unfolded state in some embodiments according to the present disclosure. FIG. 5 is a cross-sectional side view of the pivotable support apparatus along an A-A' line in FIG. 4A. FIG. 6 is a cross-sectional side view of a pivotable support apparatus in a folded state in souse embodiments according to the present disclosure. FIG. 7 is a perspective view of a display apparatus having a pivotable support apparatus in a folded state in some embodiments according to the present disclosure. Referring to FIG. 4A to FIG. 7, the hinge structure in some embodiments includes a first mass shaft 320 and a second main shaft 330 respectively providing a first rotational axis and a second rotational axis parallel to each other. The pivotable support apparatus in some embodiment's father includes a synchronized gear configured to synchronize rotation of the first main shaft 320 and the second main shaft 330. The synchronized gear includes a first gear 103 and a second gear 104 configured to rotate about the first main shaft 320 and the second main shaft 330, respectively. The first gear 103 and the second gear 104 are configured to be engaged with each other.

In some embodiments, the pivotable support apparatus further includes a first actuating rod 17, a first crank shaft 21 attached to the first actuating rod 17, a second actuating rod 18, and a second crank shaft 22 attached to the second actuating rod 18. The first crank shaft 21 includes a third gear 401 (see, also, FIG. 15A) configured to be engaged with the first gear 103; the second crank shaft 22 includes a fourth gear 401' (see, also, FIG. 15B) configured to be engaged with the second gear 104. Movements of the first actuating rod 17, the first crank shaft 21, the second actuating rod 18, the second crank shaft 22 are synchronised through engagement among the first gear 103, the second gear 104, the third gear 401, and the fourth gear 401'.

In one example, when the pivotable support apparatus transitions from an unfolded state to a folded state, or when the pivotable support apparatus transitions from a folded state to an unfolded state, the first actuating rod 17 drives the first crank shaft 21 to rotate. The third gear 401 of the first crank shaft 21 is engaged with the first gear 103, the third gear 401 drives the first gear 103 to rotate. The first gear 103 is engaged with the second gear 104, the first gear 103 chives the second gear 104 to rotate. The second gear 104 is engaged with the fourth gear 401' of the second crank shaft 22, the second gear 104 drives the fourth gear 401' to rotate. The second crank shaft 22 in turn drives the second actuating rod 18 to rotate.

In another example, when the pivotable support apparatus transitions from a folded state to an unfolded state, or when the pivotable support apparatus transitions from an unfolded state to a folded state, the second actuating rod 18 drives the second crank shaft 22 to rotate. The fourth gear 401' of the second crank shaft 22 is engaged with the second gear 104, the fourth gear 401' chives the second gear 104 to rotate. The second gear 104 is engaged with the first gear 103, the second gear 104 drives the first gear 103 to rotate. The first gear 103 is engaged with the third gear 401 of the first crank shaft 21, the first gear 103 drives the third gear 401 to rotate. The first crank shaft 21 in turn drives the first actuating rod 17 to rotate.

Figure 8A:
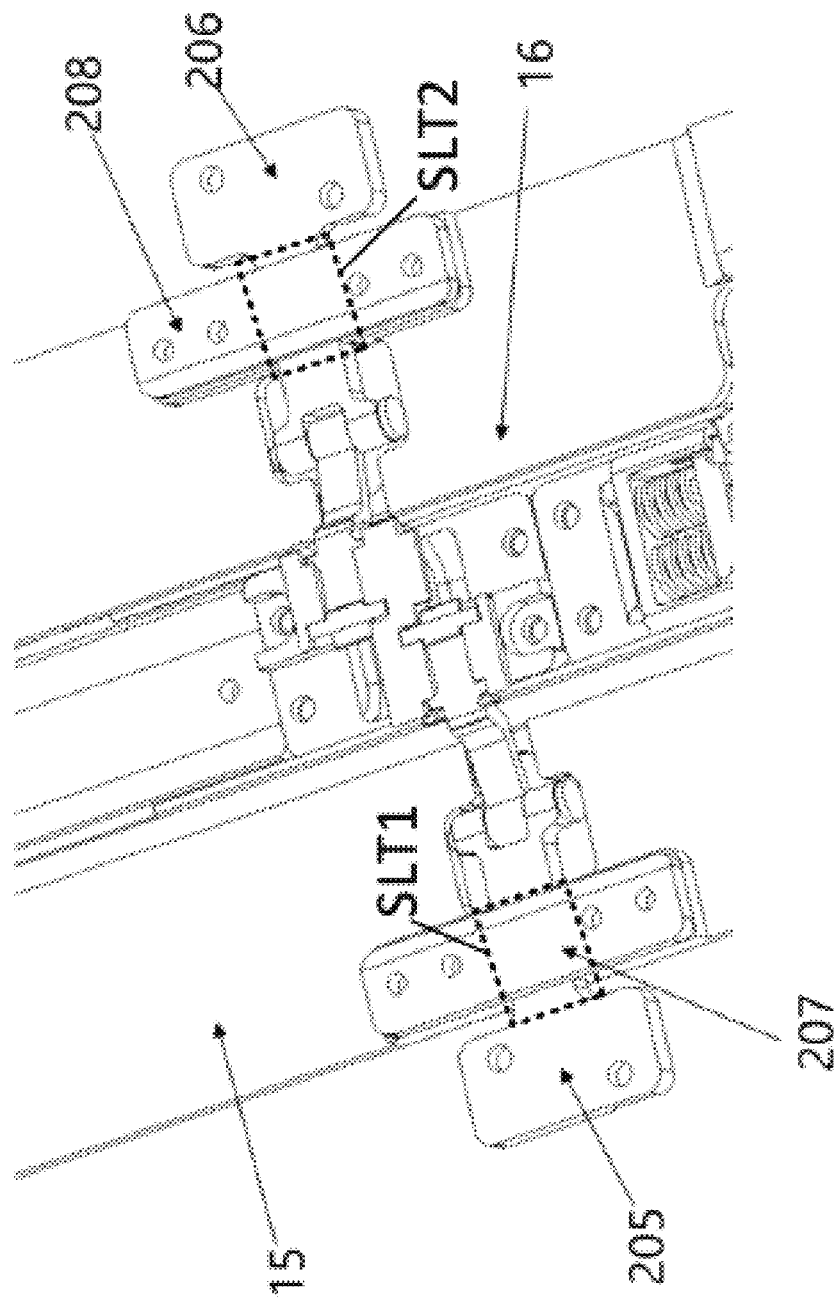
FIG. 8A is a perspective view of a sliding groove assembly in a pivotable support apparatus in an unfolded state in some embodiments according to the present disclosure.
Figure 8B:
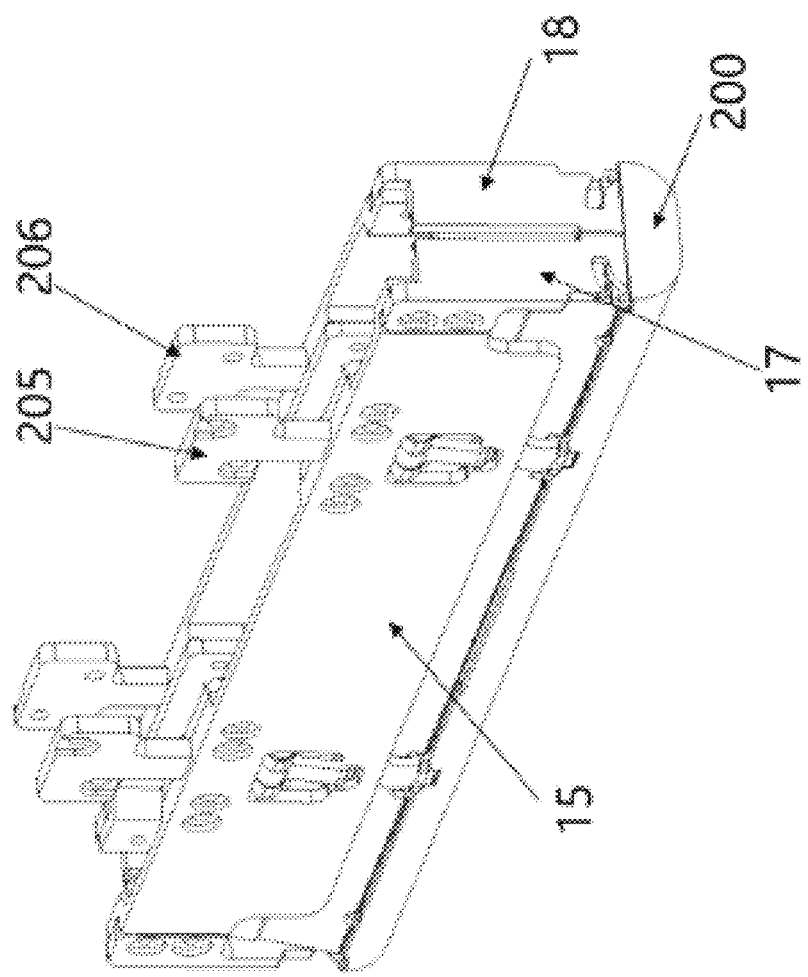
FIG. 8B is a perspective view of a sliding groove assembly in a pivotable support apparatus in a folded state in some embodiments according to the present disclosure.
Figure 9:
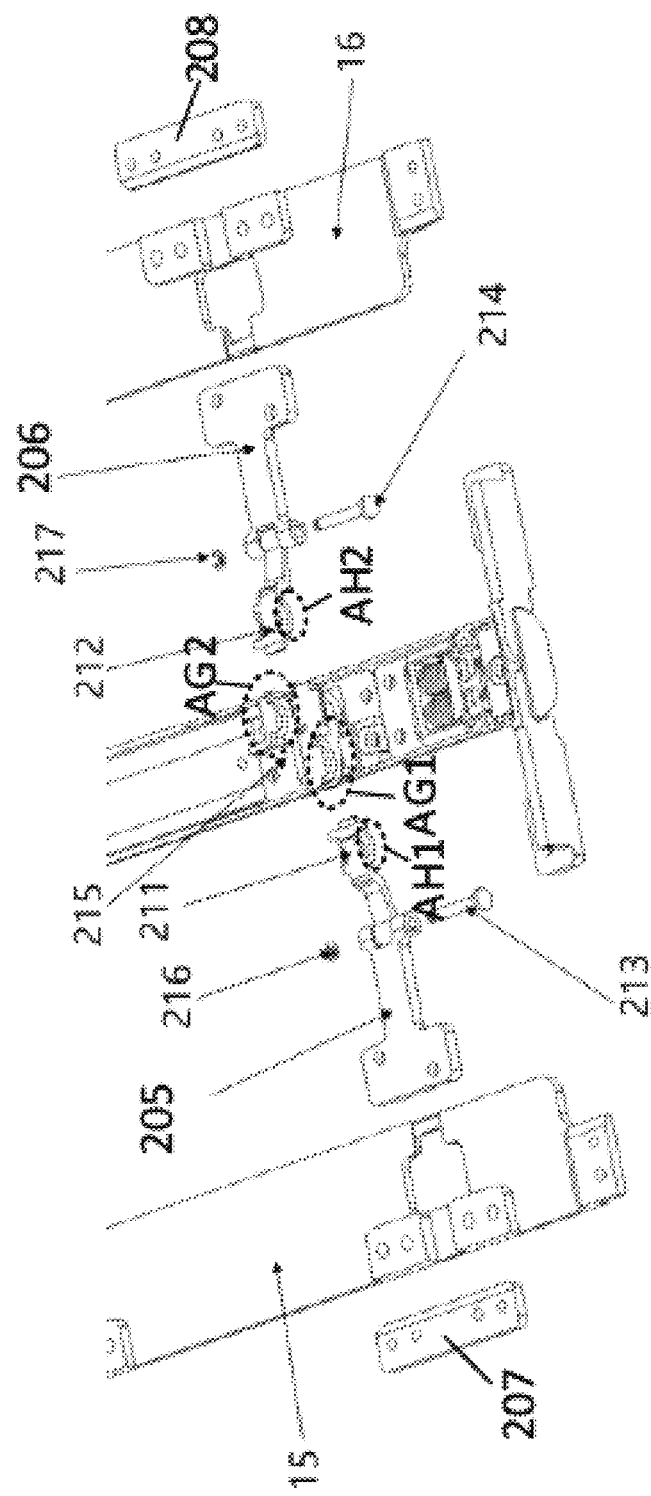
FIG. 9 is an exploded view of a sliding groove assembly in a pivotable support apparatus in an unfolded state in some embodiments according to the present disclosure.
Figure 10:
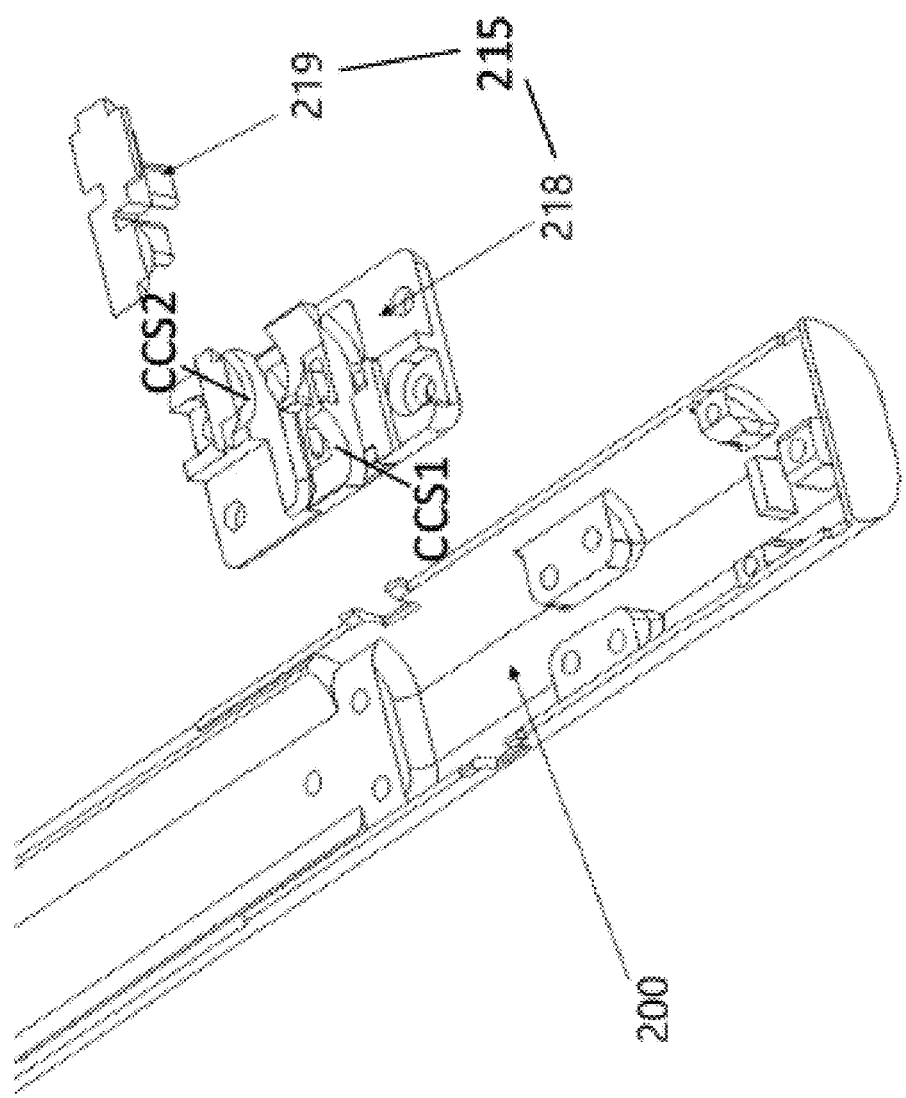
FIG. 10 is an exploded view of a sliding groove structure and a cladding board in a pivotable support apparatus in some embodiments according to the present disclosure.

In some embodiments, the pivotable support apparatus further includes a sliding groove assembly. FIG. 8A is a perspective view of a sliding groove assembly in a pivotable support apparatus in an unfolded state in some embodiments according to the present disclosure. FIG. 8B is a perspective view of a sliding groove assembly in a pivotable support apparatus in a folded state in some embodiments according to the present disclosure. FIG. 9 is as exploded view of a sliding groove assembly in a pivotable support apparatus in an unfolded state in some embodiments according to the present disclosure. FIG. 10 is an exploded view of a sliding groove structure and a cladding board in a pivotable support apparatus in some embodiments according to the present disclosure. Referring to FIG. 8A to FIG. 10, the pivotable support apparatus in some embodiments includes a sliding groove structure 215; a first rotating rod 211 and a second rotating rod 212 slidably and rotatably attached to the sliding groove structure 215; s first rotating plate 15; a second rotating plate 16; a first connecting rod 205 rotatably attached to the first rotating rod 211, and configured to move slidably relative to the first rotating plate 15; and a second connecting rod 206 rotatably attached to the second rotating rod 212, and configured to move slidably relative to the second rotating plate 16. As used herein the term, "rotatably attached" signifies that two components are engaged such that the two components are mechanically coupled but may still rotate with respect to one another about an axis. For example, the first rotating rod 211 is rotatably attached to the sliding groove structure 215 in a manner, in which the first rotating rod 211 can be rotate between at least a first rotated position and a second rotated position relative to the sliding groove structure 215, e.g., about an axis. As used herein the term, "slidably attached" signifies that two components are engaged such that the two components are mechanically coupled but may still slide with respect to one another. For example, the first rotating rod 211 is slidably attached to the sliding groove structure 215 in a manner, in which the first rotating rod 211 can be slid between at least a first position and a second position relative to the sliding groove structure 215, e.g., over a surface of the sliding groove structure 215.

In some embodiment, the sliding groove structure 215 includes a first are shaped groove AG1 and a second are shaped groove AG2. The first rotating rod 211 includes a first arc shaped rod head AH1 configured to be movable slidably and rotatably in the first arc shaped groove AG1. The second rotating rod 212 includes a second are shaped rod head AH2 configured to be movable slidably and rotatably in the second are shaped groove AG2.

Various appropriate implementations may be practiced for providing the sliding groove structure 215. Is some embodiments, the sliding groove structure 215 includes a first part 218 and a second part 219 fixedly attached to each other to focus a first are shaped groove AG1 and a second are shaped groove AG2. The first part 218 and the second part 219 may be fixedly attached to each other by various appropriate means. In one example, the first part 218 and the second part 219 are welded together. In another example, the first part 218 and the second part 219 are attached together by one or more screws.

Figure 11:
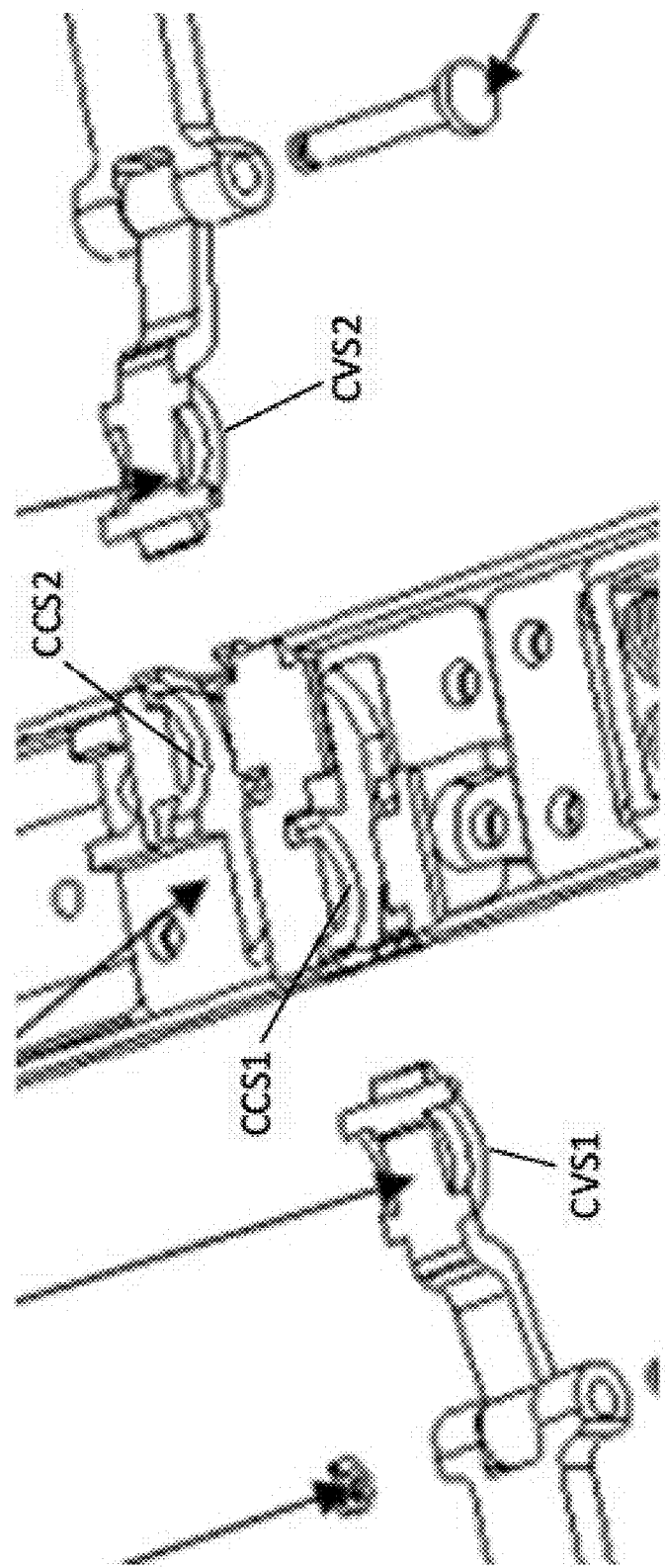
FIG. 11 is a zoom-in view of FIG. 9 in a region surrounding a sliding groove structure.

FIG. 11 is a zoom-in view of FIG. 9 in a region surrounding a sliding groove structure. Referring to FIG. 8A to FIG. 11, the first part 218 includes a first are shaped concave surface CCS1 and a second are shaped concave surface CCS2. The first are shaped rod head AH1 includes a first are shaped convex surface CVS1 at least partially in contact with the first are shaped concave surface CCS1. The second are shaped rod head AH2 includes a second are shaped convex surface CVS2 at least partially in contact with the second are shaped concave surface CCS2.

Referring to FIG. 10, the pivotable support apparatus includes a cladding board 200 configured to at least partially receive the first part 218. Optionally, the first part 218 is fixedly attached to the cladding board 200. The first part 218 may be fixedly attached to the cladding board 200 by various appropriate means. Is one example, the first part 218 is attached to the cladding board 200 by one or more screws. In another example, the first part 218 is welded to the cladding board 200.

Figure 8C:
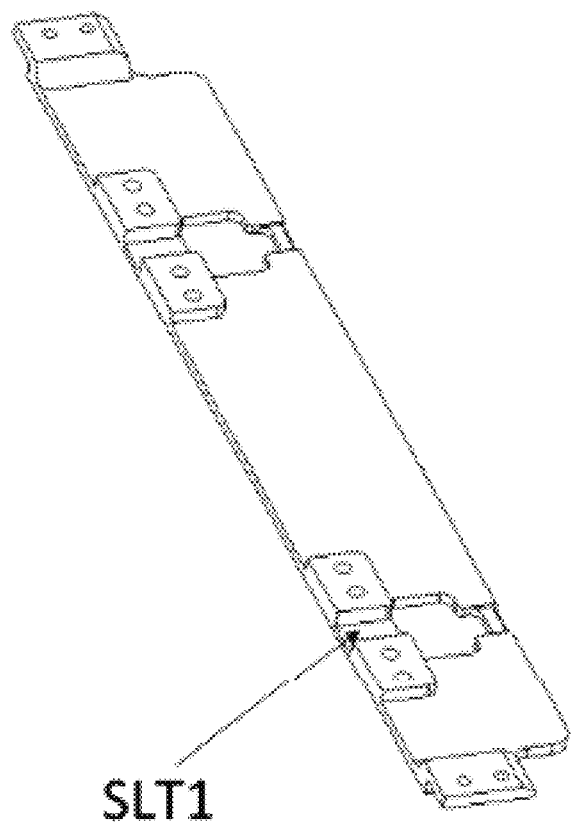
FIG. 8C is a perspective view of a first rotating plate in a pivotable support apparatus in some embodiments according to the present disclosure.
Figure 8D:
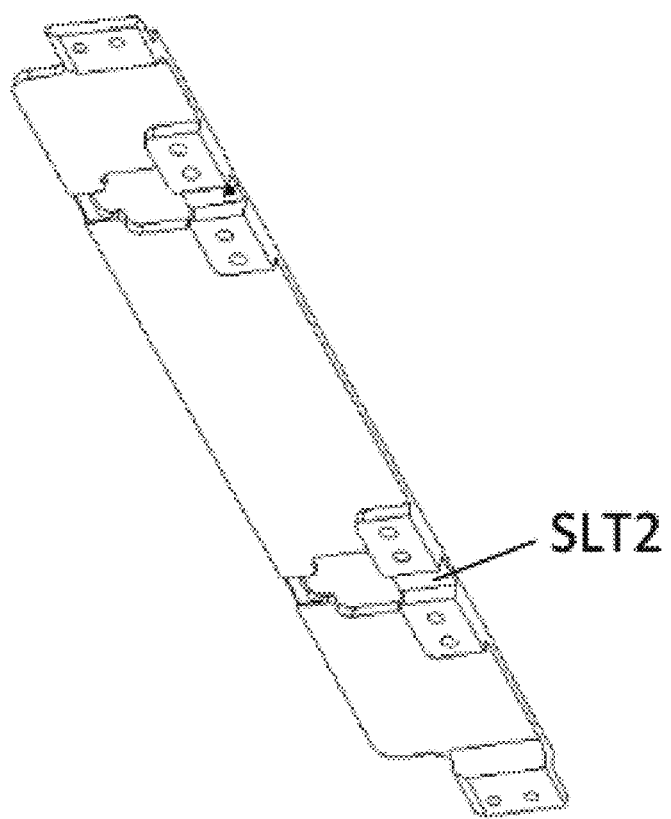
FIG. 8D is a perspective view of a second rotating plate in a pivotable support apparatus in some embodiments according to the present disclosure.

FIG. 8C is a perspective view of a first rotating plate in a pivotable support apparatus in some embodiments according to the present disclosure. FIG. 8D is a perspective view of a second rotating plate in a pivotable support apparatus in some embodiments according to the present disclosure. Referring to FIG. 8C and FIG. 8D, the first rotating plate in some embodiments includes a first sliding slot SLT1, and the second rotating plate in some embodiments includes a second sliding slot SLT2.

In some embodiments, the pivotable support apparatus further includes a first retaining plate 207 and a second retaining plate 208. A first sliding slot SLT1 is between the fast retaining plate 207 and the first rotating plate 15. The first connecting rod 205 is configured to move slidably in the first sliding slot SLT1. A second sliding slot SLT2 is between the second retaining plate 208 and the second rotating plate 16. The second connecting rod 206 is configured to move slidably in the second sliding slot SLT2. The first sliding slot SLT1 is configured to allow the first connecting rod 205 move slidably relative to the first rotating plate 15. The second sliding slot SLT2 is configured to allow the second connecting rod 206 move slidably relative to the second rotating plate 16.

Various appropriate implementations may be practiced for providing the first retaining plate 207 and the second retaining plate 208. In some embodiments, the first retaining plate 207 is fixedly attached to the first rotating plate 15; and the second retaining plate 208 is fixedly attached to the second rotating plate 16. The first retaining plate 207 may be fixedly attached to the first rotating plate 15 by various appropriate means; and the second retaining plate 208 may be fixedly attached to the second rotating plate 16 by various appropriate means. In one example, the first retaining plate 207 is attached to the first rotating plate 15 by que or more screws. In another example, the first retaining plate 207 is welded to the first rotating plate 15. In one example, the second retaining plate 208 is attached to the second rotating plate 16 by one or more screws. In another example, the second retaining plate 208 is welded to the second rotating plate 16.

Referring to FIG. 4A and FIG. 4B, in some embodiments, the first rotating plate 15 is fixedly attached to the first actuating rod 17; and the second rotating plate 16 is fixedly attached to the second actuating rod 18. The first rotating plate 15 may be fixedly attached so the first actuating rod 17 by various appropriate means; and the second rotating plate 16 way be fixedly attached to the second actuating rod 18 by various appropriate means. In one example, the first rotating plate 15 is attached to the first actuating rod 17 by one or more screws. In another example, the first rotating plate 15 is welded to the first actuating rod 17. In one example, the second rotating plate 16 is attached to the second actuating rod 18 by one or more screws. In another example, the second rotating plate 16 is welded to the second actuating rod 18.

The first rotating rod 211 may be rotatably attached to the first connecting rod 205 by various appropriate means; and the second rotating rod 212 may be rotatably attached to the second connecting rod 206 by various appropriate means. Referring to FIG. 9, in some embodiments, the first rotating rod 211 is rotatably attached to the first connecting rod 205 by a first pin 213; and the second rotating rod 212 is rotatably attached to the second connecting rod 206 by a second pin 214. The pivotable support apparatus further includes a first clamping spring 216 for locking the first pin 213 in position and a second clamping spring 217 for locking the second pin 214 in position.

The pivotable support apparatus in some embodiments further includes a support plate 300. The support plate 300 in some embodiments includes a first support part 301, a second support past 302, and a third support part 303. The first support part 301 and the second support part 302 are spaced apart by a sliding groove structure. The third support part 303 and the second support part 302 are spaced apart by another sliding groove structure. Referring to FIG. 5, the pivotable support apparatus in some embodiments further includes a first sliding plate 13 and a second sliding plate 14 on two opposite sides of the support plate 300. Optionally, is an unfolded state of the pivotable support apparatus, the support plate 300, the first sliding plate 13, and the second sliding plate 14 form pasts of a substantially flat surface for supporting the foldable display panel. As used herein, the term "substantially flat surface" may include small deviations from flat surface geometries, for example, deviations due to manufacturing processes. The term "substantially fat" is inclusive of a case of being partially convex or partially concave as well as a case of being fully flat.

Figure 12:
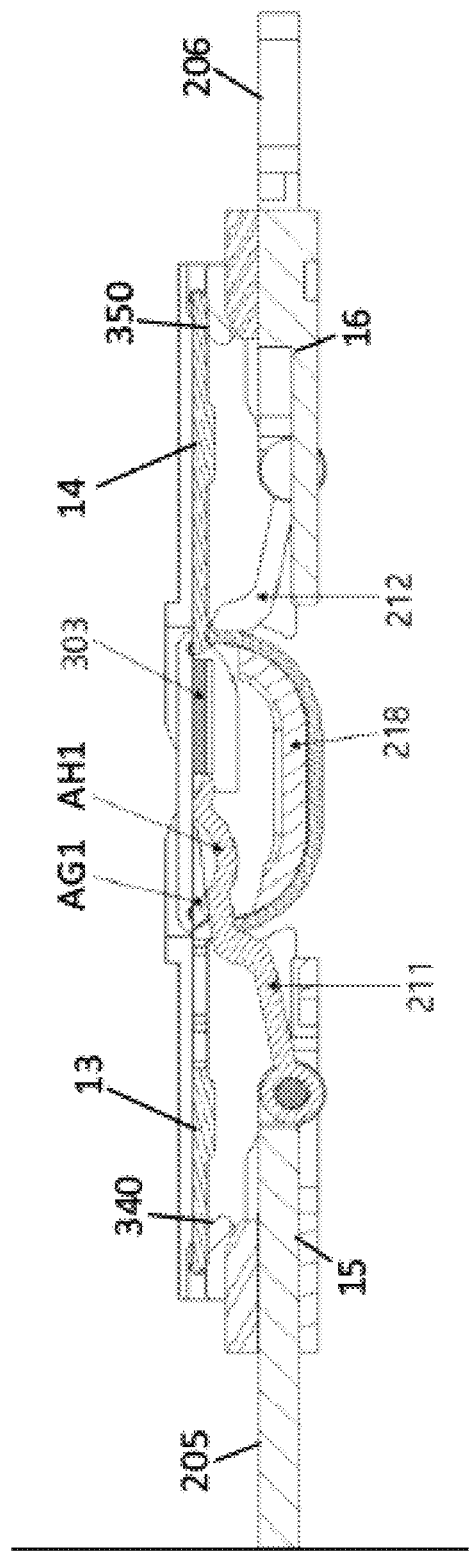
FIG. 12 is a cross-sectional side view of a pivotable support apparatus in a unfolded state in some embodiments according to the present disclosure.

FIG. 12 is a cross-section side view of a pivotable support apparatus in a unfolded state in some embodiments according to the present disclosure. FIG. 12 is a cross-sectional side view of the pivotable support apparatus along a B-B' line in FIG. 4A. Referring to FIG. 4A to FIG. 9, and FIG. 12, when the first actuating rod 17 and/or the second actuating rod 18 rotates, they drive the first rotating plate 15 and/or the second rotating plate 16 (and the first retaining plate 207 and/or the second retaining plate 208) to rotate. When the first rotating plate 15 and the first retaining plate 207 rotate, the first connecting rod 205 is configured to move slidably in the first sliding slot SLT1. When the second rotating plate 16 and the second retaining plate 208 rotate, the second connecting rod 2016 is configured to move slidably in the second sliding slot SLT2. When the first connecting rod 205 moves slidably, it drives the first rotating rod 211 to slide and rotate about the first arc shaped groove AG1. When the second connecting rod 206 moves slidably, it dives the second rotating rod 212 to slide and rotate about the second are shaped groove AG2. Thus, the first actuating rod 17 and the first rotating rod 211 rotate about different axes, and the second actuating rod 18 and the second rotating rod 212 rotate about different axes. When the pivotable support apparatus folds, the first connecting rod 205 is configured to move slidably in the first sliding slot SLT1, moving the first connecting rod 205 further away from the first rotating plate IS (e.g., "outward"); the second connecting rod 206 is configured to move slidably in the second sliding slot SLT2, moving the second connecting rod 206 further away from the second rotating plate 16 (e.g., "outward"). When the pivotable support apparatus unfolds, the first connecting rod 205 is configured to move slidably in the first sliding slot SLT1, moving the first connecting rod 205 closer to the first rotating plate 15 (e.g., "inward"); the second connecting rod 206 is configured to move slidably in the second sliding slot SLT2, moving the second connecting rod 206 closer to the second rotating plate 16 (e.g., "inward").

Referring to FIG. 2, the pivotable support apparatus in some embodiments further includes a first frame 203 and a second frame 204. In some embodiments, the first connecting rod 205 is fixedly attached to the first frame 203; and the second connecting rod 206 is fixedly attached to the second frame 204. The first connecting rod 205 may be fixedly attached to the first frame 203 by various appropriate means; and the second connecting rod 206 may be fixedly attached to the second frame 204 by various appropriate means. In one example, the first connecting rod 205 is attached to the first frame 203 by one or more screws. In another example, the first connecting rod 205 is welded to the first frame 203. In one example, the second connecting rod 206 is attached to the second frame 204 by one or more screws. Is another example, the second connecting rod 206 is welded to the second fame 204.

In some embodiments, the first frame 203 and the first connecting rod 205 are configured to move slidably relative to the first rotating plate 15; and the second frame 204 and the second connecting rod 206 are configured to move slidably relative to the second rotating plate 16. When the pivotable support apparatus folds, the first connecting rod 205 is configured to move slidably in the first sliding slot SLT1, moving the first frame 203 and the first connecting red 205 further away from the first rotating plate 15 (e.g., "outward"); the second connecting rod 206 is configured to move slidably in the second sliding slot SLT2, moving the second frame 204 and the second connecting rod 206 further away from the second rotating plate 16 (e.g., "outward"). When the pivotable support apparatus unfolds, the first connecting rod 205 is configured to move slidably in the first sliding slot SLT1, moving the first frame 203 and the first connecting rod 205 closer to the first rotating plate 15 (e.g., "inward"); the second connecting rod 206 is configured to move slidably in the second sliding slot SLT2, moving the second frame 204 and the second connecting rod 206 closer to the second rotating plate 16 (e.g., "inward").

Figure 13:
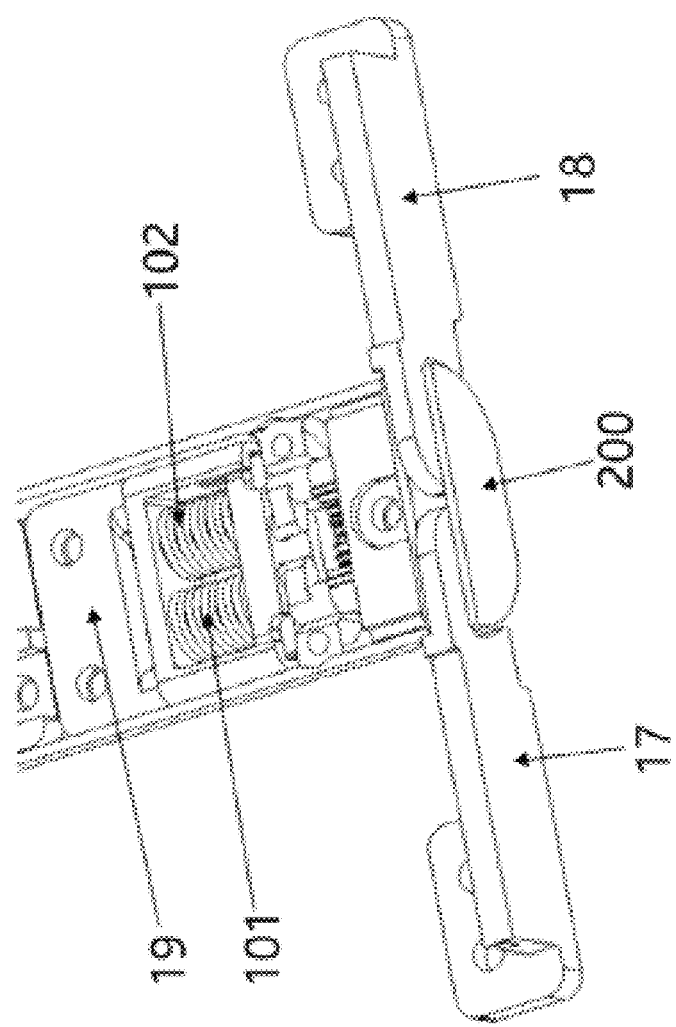
FIG. 13 is a perspective view of a damping assembly in a pivotable support apparatus in an unfolded state in some embodiments according to the present disclosure.
Figure 14:
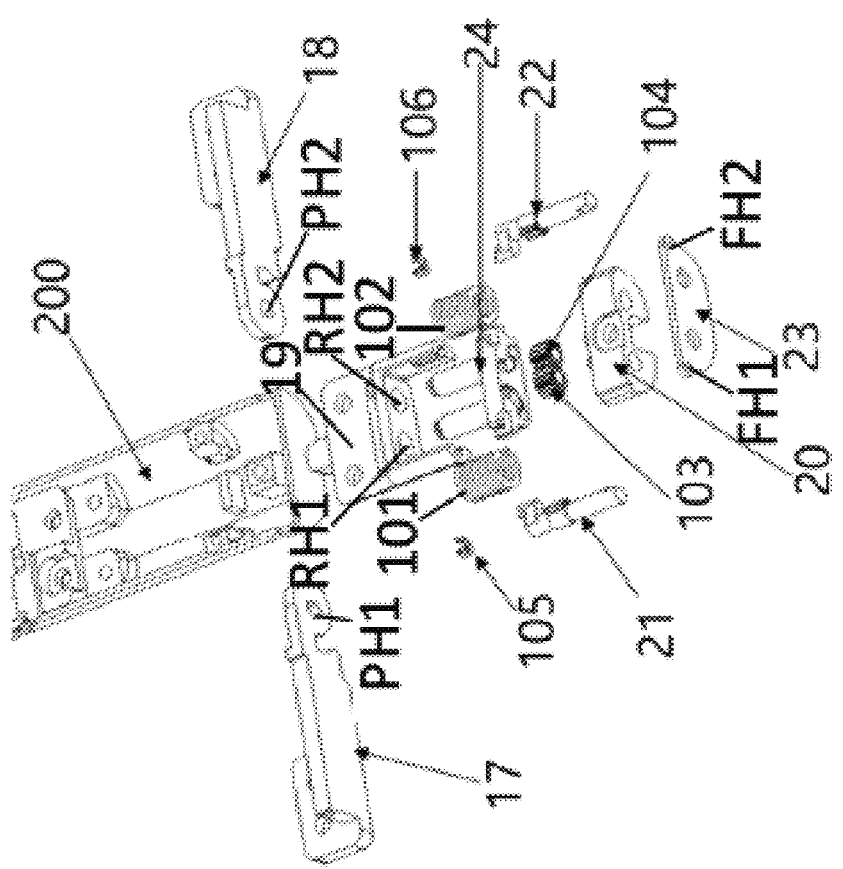
FIG. 14 is an exploded view of a damping assembly in a pivotable support apparatus in an unfolded state in some embodiments according to the present disclosure.

In some embodiments, the pivotable support apparatus includes a damping assembly configured to damp the movement of the pivotable support apparatus during folding or unfolding. FIG. 13 is a perspective view of a damping assembly in a pivotable support apparatus in an unfolded state in some embodiments according to the present disclosure. FIG. 14 is an exploded view of a damping assembly in a pivotable support apparatus in an unfolded state in some embodiments according to the present disclosure. Referring to FIG. 13 and FIG. 14, in some embodiments, the first crank shaft 21 is attached into a first pin hole PH1 in the fest actuating rod 17, the second crank shaft 22 is attached into a second pin hole PH2 in the second actuating rod 18. FIG. 13 shows that the first crank shaft 21 is attached into a fast pin bole PH1 and the second crank shaft 22 is attached into a second pin hole PH2. FIG. 14 shows aw exploded view. The first crank shaft 21 and the first actuating rod 17 are configured to rotate together; and the second crank shaft 22 and the second actuating rod 18 are configured to rotate together.

In some embodiment, the pivotable support apparatus further inches a damping slider 24 configured to be resiliently pressing ow the first crank shaft 21 and the second crank shaft 22, providing damping resistance when the first crank shaft 21 and the first actuating rod 17 rotate relative to the second crank shaft 22 and the second actuating rod 18. By having the damping slider 24 provide damping resistance, the rotation of the hinge structure of the pivotable support apparatus may be stopped at any moment when an external force is withdrawn.

Figure 15A:
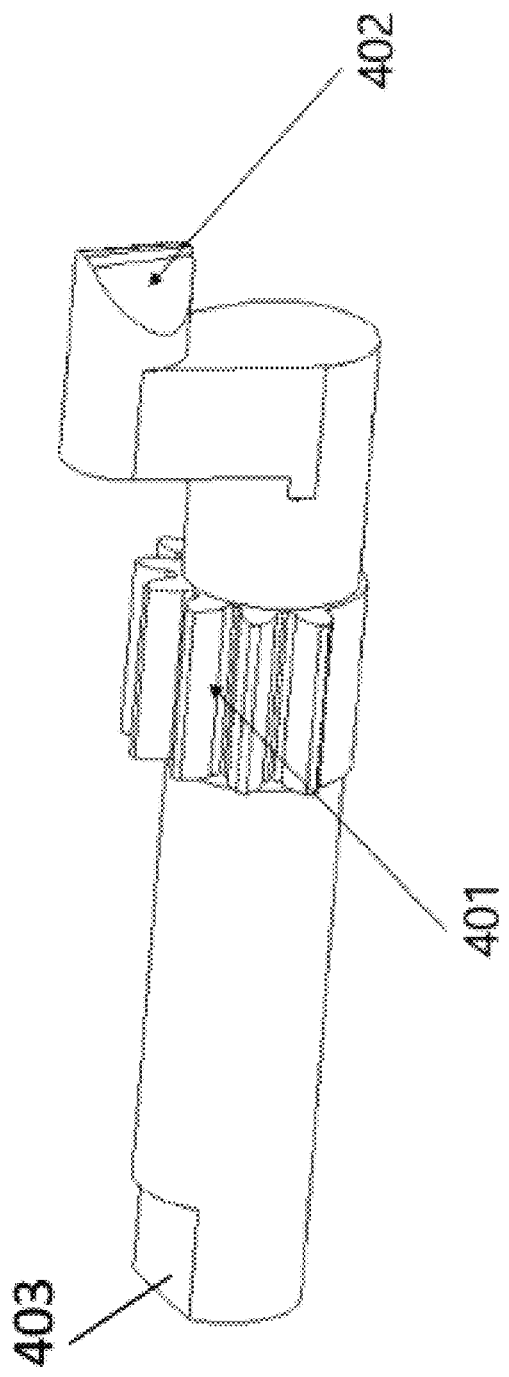
FIG. 15A is a perspective view of a first crank shaft in a pivotable support apparatus in some embodiments according to the present disclosure.
Figure 15B:
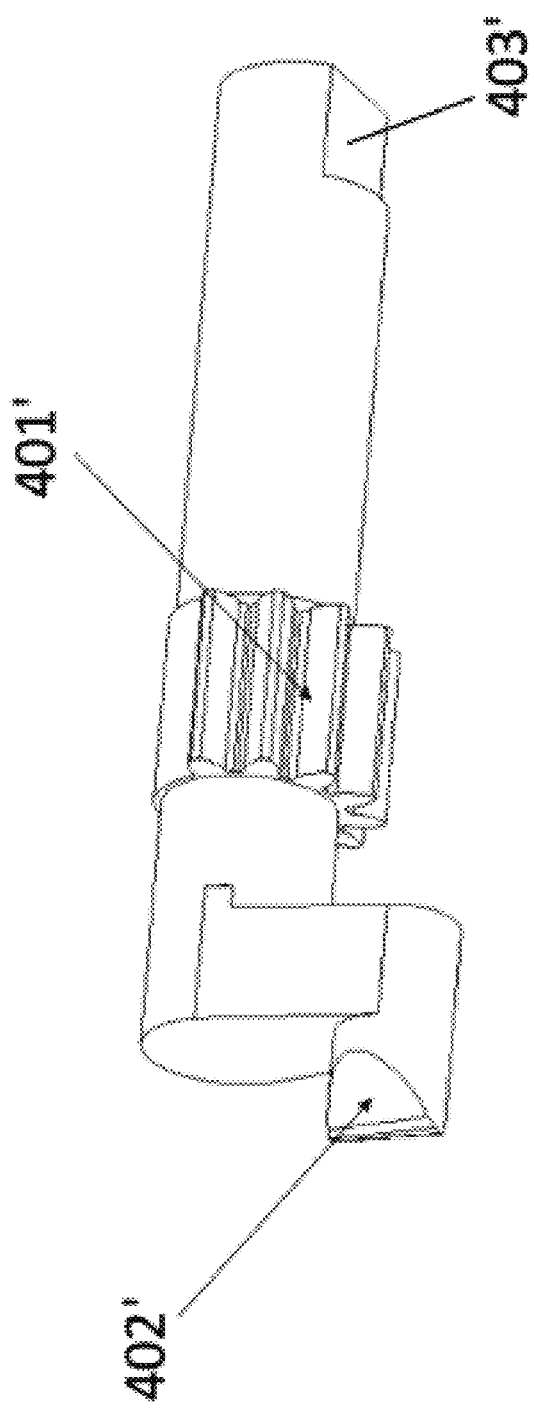
FIG. 15B is a perspective view of a second crank shaft in a pivotable support apparatus in some embodiments according to the present disclosure.

FIG. 15A is a perspective view of a first crack shaft in a pivotable support apparatus in some embodiments according to the present disclosure. FIG. 13B is a perspective view of a second crank shaft in a pivotable support apparatus in some embodiments according to the present disclosure. Referring to FIG. 15A, the first crank shaft includes a first cam bar 402, a third gear 401, and a fast tip 403. The third gear 401 is in a middle portion of the first crank shaft, the first cam bar 402 and the fast tip 403 are on two ends of the first crank shaft, respectively. Referring to FIG. 15B, the second crank shaft includes a second cam bar 402', a fourth gear 401', and a second tip 403'. The fourth gear 401' is in a middle portion of the second crank shaft, the second cam bar 402' and the second tip 403' are on two ends of the second crank shaft, respectively. The first tip 403 is configured to be attached into a first pin bole PH1 in the first actuating rod 17, the second up 403' is configured to be attached into a second pin hole PH2 in the second actuating rod 18.

Figure 16:
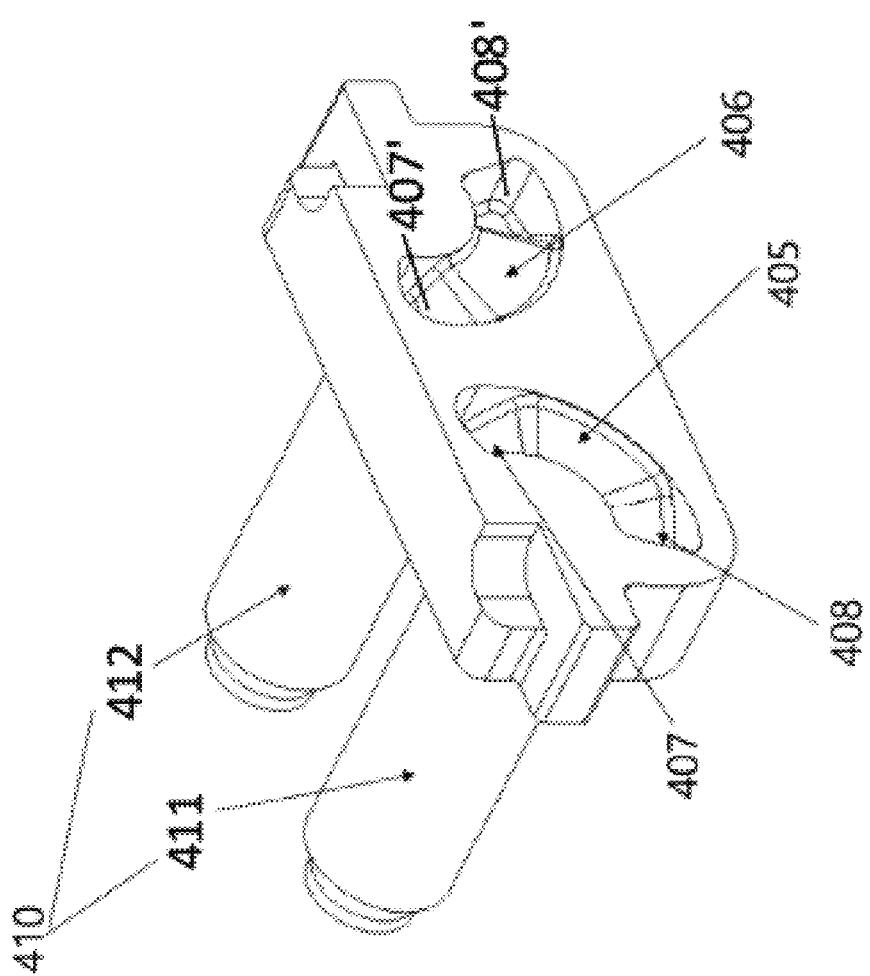
FIG. 16 is a perspective view of a damping slider in a pivotable support apparatus a some embodiments according to the present disclosure.

FIG. 16 is a perspective view of a damping sider in a pivotable support apparatus as some embodiments according to the present disclosure. Referring to FIG. 16, the damping slider in some embodiments includes a first notch 407, a second watch 407', a third notch 408, and a fourth notch 408'. Referring to FIG. 13, FIG. 14, FIG. 15A, FIG. 15B, and FIG. 16, in a unfolded state of the pivotable support apparatus, the first cam bar 402 is configured to be engaged with the first notch 407, and the second cam bar 402' is configured to be engaged with the second notch 407', Referring to FIG. 13, FIG. 14, FIG. 15A, FIG. 15B, and FIG. 16, in a folded state of the pivotable support apparatus, the first cam bar 402 is configured to be engaged with the third notch 408, and the second cam bar 402' is configured to be engaged with the fourth notch 408'. When the pivotable support apparatus transitions from the unfolded state to the folded state, the first cam bar 402 has to overcome certain amount of resistance to glide out of the first notch 407, and similarly the second cam bar 402' has to overcome certain amount of resistance to glide out of the second notch 407'. When the pivotable support apparatus transitions from the folded state to the unfolded state, the first cam bar 402 has to overcome certain amount of resistance to glide out of the third notch 408, and similarly the second cam bar 402' has to overcome certain amount of resistance to glide out of the fourth notch 408'. The engagement between the first cam bar 402 and the first notch 407, and the engagement between the second cam bar 402' and the second notch 407', provide a position-limiting function in the unfolded state of the pivotable support apparatus. The engagement between the first cam bar 402 and the third notch 408, and the engagement between the second cam bar 402' and the fourth notch 408', provide a position-limiting function in the folded state of the pivotable support apparatus.

In some embodiments, the damping slider fisher includes a first groove 405 positioned between the first notch 407 and the third notch 408, and a second groove 406 positioned between the second notch 407' and the fourth notch 408'. The first groove 405 is relatively more shallow as compared to the first notch 407 and the shard notch 408; and the second groove 406 is relatively more shallow as compared to the second notch 407' and the fourth notch 408'. During a movement between the folded state and the unfolded state of the pivotable support apparatus, the first cam bar 402 is in contact with and gliding on a surface of the first groove 405, the second cam bar 402' is in contact with and gliding on a surface of the second groove 406, thereby damping the movement of the pivotable support apparatus. For example, when the pivotable support apparatus transitions from the unfolded state to the folded state, the first cam bar 402 first glides out of the first notes 407, and then glides on the surface of the first groove 405, and slides into the third notch 408; similarly the second cam bar 402' first glides out of the second notch 407', glides on the surface of the second groove 406, and then slides into the fourth notch 408'. In another example, when the pivotable support apparatus transitions from the folded state to the unfolded state, the first cam bar 402 first glides out of the third notch 408, and then glides on the surface of the first groove 405, and slides into the first notch 407, similarly the second cam bar 402' first glides out of the fourth notch 408', glides on the surface of the second groove 406, and then slides into the second notch 407.

In some embodiments, the pivotable support apparatus further includes one or more springs configured to apply a force to the damping slider 24 to maintain the damping slider 24 in contact with the first cam bar 402 and the second cam bar 402'. Referring to FIGS. 13 to 16, in one example, the pivotable support apparatus includes a first spring 101 and a second spring 102. The first spring 101 and the second spring 102 are configured to apply a force to the damping slider to maintain the damping slider 24 in contact with the first cam bar 402 and the second cam bar 402'.

In some embodiment, the dumping slider 24 further includes one or more spring shafts 410 extending through the one or more springs, respectively. In one example, the damping slider 24 farther includes a first spring shaft 411 extending through the first spring 101 and a second spring shaft 412 extending through the second spring 102.

In some embodiments, the pivotable support apparatus further includes a fastener 19. The fastener 19 includes one or more receiving holes configured to receive terminals of one or more spring shafts, respectively. Is que example, the fastener 19 includes a first receiving hole RH1 configured to receive a terminal of the first spring shaft 411, and a second receiving bole RH2 configured to receive a terminal of the second spring shaft 412.

Referring to FIG. 14, the pivotable support apparatus in some embodiments father includes a sliding plate fastener 23. Referring to FIG. 4A, FIG. 4B. FIG. 5 to FIG. 7, and FIG. 12, the pivotable support apparatus in some embodiments further includes a first sliding plate 13 and a second sliding plate 14. Referring to FIG. 4A and FIG. 4B, the first sliding plate 13 is slidably attached to the first actuating rod 17; and the second sliding plate 14 is slidably attached to the second actuating rod 18. Optionally, the first sliding plate 13 and the second sliding plate 14 are fixedly attached to the sliding plate fastener 23.

In some embodiments, referring to FIG. 6, in a folded state of the pivotable support apparatus, a first included angle α between the first siding plate 13 and the second sliding plate 14 is greater than a second included angle between the first actuating rod 17 and the second actuating rod 18 (the second included angle in FIG. 6 is zero). In some embodiments, the second included angle is in a range of 0 degree to 10 degrees, e.g., 0 degree to 1 degrees, 1 degree to 2 degrees, 2 degree to 3 degrees, 3 degree to 4 degrees, 4 degree to 5 degrees, 5 degree to 6 degrees, 6 degree to 7 degrees, 7 degree to 8 degrees, 8 degree to 9 degrees, or 9 degree to 10 degrees. In some embodiments, the first included angle α is in a range of 10 degree to 75 degrees, e.g., 10 degree to 15 degrees, 15 degree to 20 degrees, 20 degree to 25 degrees, 25 degree to 30 degrees, 30 degree to 35 degrees, 35 degree to 40 degrees, 40 degree to 45 degrees, 45 degree to 50 degrees, 50 degree to 55 degrees, 55 degrees to 60 degrees, 60 degree to 65 degrees, 65 degree to 70 degrees, or 70 degree to 75 degrees.

In some embodiment, in a folded state of the pivotable support apparatus, the first sliding plate 13 and the second sliding plate 14 are spaced apart by's first distance d1 where they are connected to the sliding plate fastener 23, respectively. The first shading plate 13 and the second sliding plate 14 are spaced apart by a second distance d2 where they are slidably attached to the first actuating rod 17 and the second actuating rod 18, respectively. Optionally, the first distance d1 is greater than the second distance d2. Optionally, a ratio of the first distance to the second distance is in a range of 3 to 100, e.g., 3 to 4, 4 to 5, 5 to 6, 6 to 7, 7 to 8, 8 to 9, 9 to 10, 10 to 12, 12 so 14, 14 to 16, 16 to 18, 18 to 20, 20 to 25, 25 to 30, 30 to 40, 40 to 50, 50 to 60, 60 to 70, 70 to 80, 80 to 90, or 90 to 100.

Figure 17A:
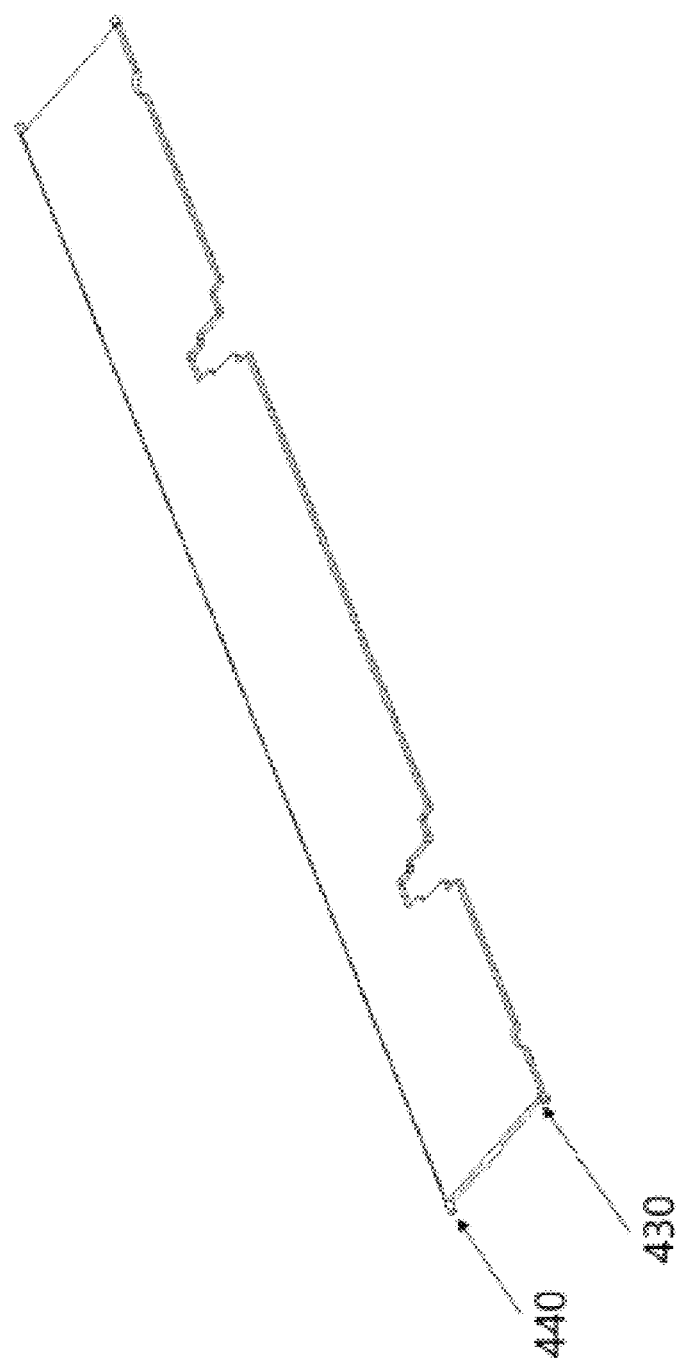
FIG. 17A is a perspective view of a first sliding plate in a pivotable support apparatus in some embodiments according to the present disclosure.
Figure 17B:
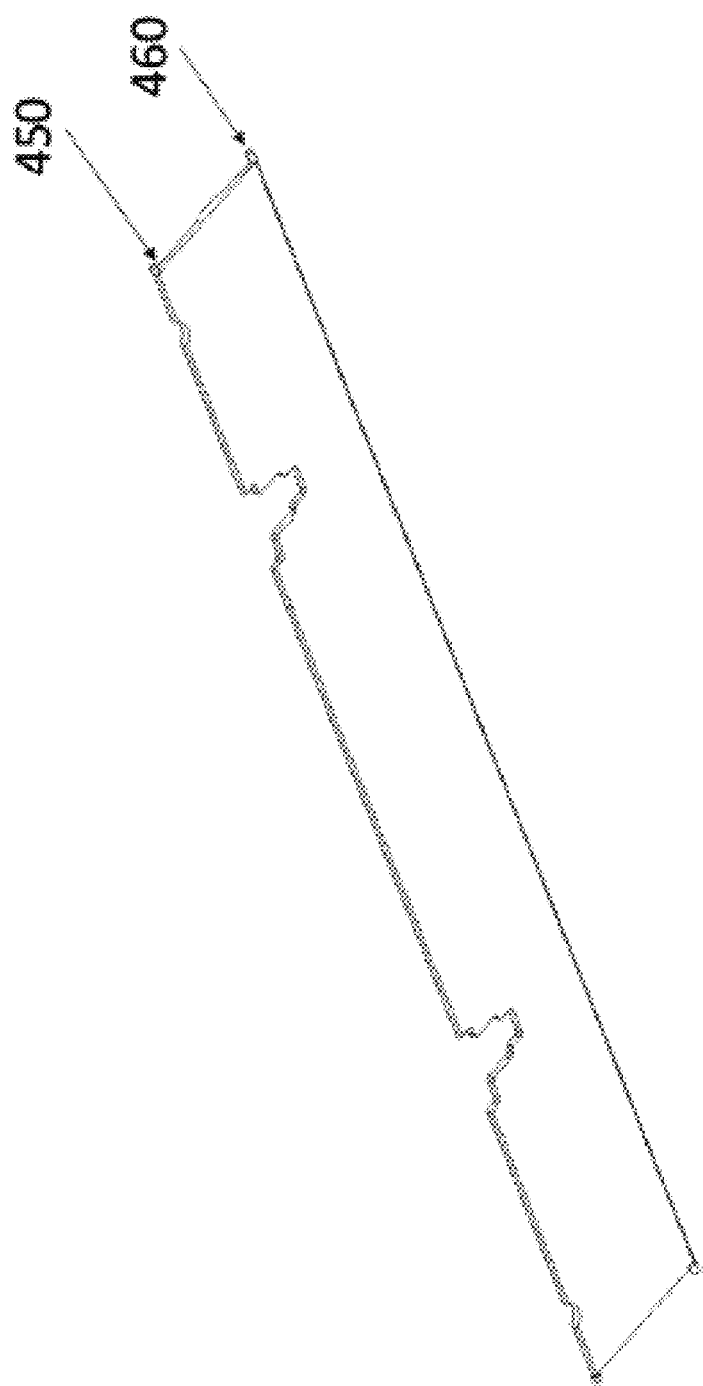
FIG. 17B is a perspective view of a second sliding plate in a pivotable support apparatus in some embodiments according to the present disclosure.

FIG. 17A is a perspective view of a first sliding plate in a pivotable support apparatus in some embodiments according to the present disclosure. FIG. 17B is a perspective view of a second sliding plate in a pivotable support apparatus in some embodiments according to the present disclosure. Referring to FIG. 4B and FIG. 17A, the first sliding plate 13 includes a first shaft 440 and a third shaft 430. Referring to FIG. 4B and FIG. 17B, the second sliding plate 14 includes a second shaft 460 and a fourth shaft 450.

In some embodiments, referring to FIG. 6, the first actuating rod 17 includes a first groove 340, and the second actuating rod 18 includes a second groove 350. The first shaft 440 of the first sliding plate 13 is configured to be received in the first groove 340, allowing the first sliding plate 13 move slidably relative to the first actuating rod 17. The second shaft 460 of the second sliding plate 14 is configured to be received in the second groove 350, allowing the second sliding plate 14 move slidably relative to the second actuating rod 18.

Figure 18:
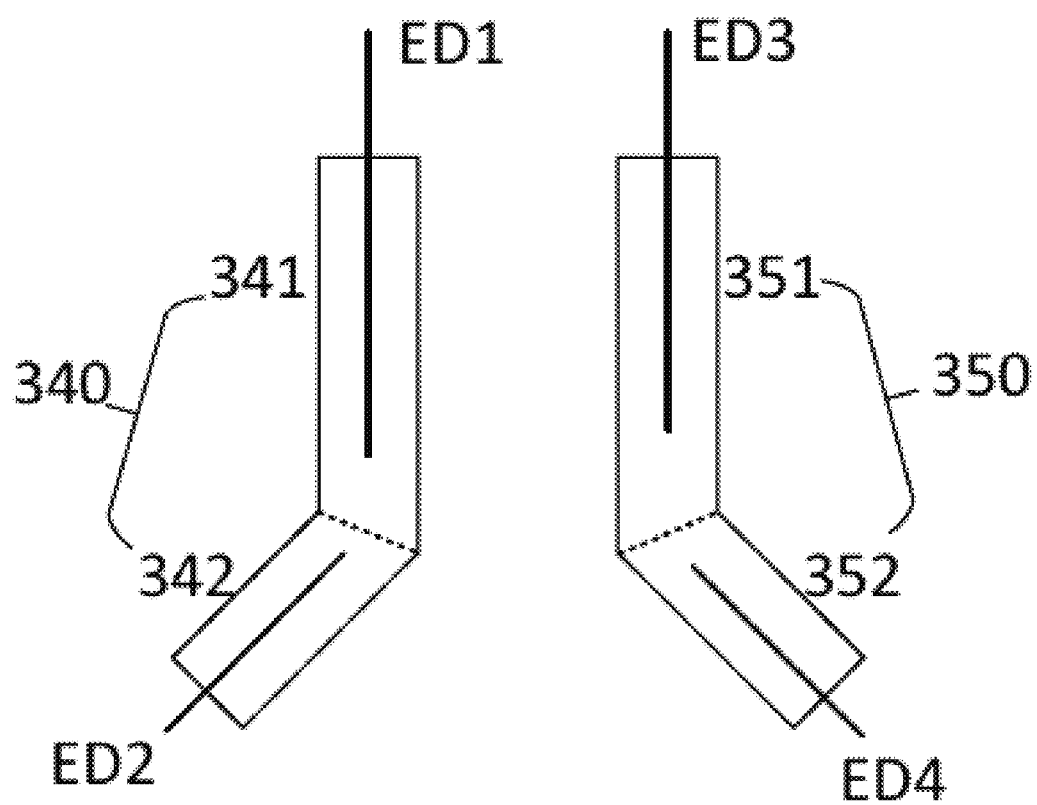
FIG. 18 is a schematic diagram illustrating the structure of a first groove and a second groove mi some embodiments according to the present disclosure.

FIG. 18 is a schematic diagram illustrating the structure of a first groove and a second groove in some embodiments according to the present disclosure. Referring to FIG. 18, we first groove 340 includes a first sub-groove 341 and a second sub-groove 342 connected with each other; the second groove 350 includes a third sub-groove 351 and a fourth sub-groove 352 connected with each other. Extension directions (e.g., ED1 and ED2 in FIG. 18) of the first sub-groove 341 and the second sub-groove 342 are at an included angle less than 180 degrees and greater than 0 degree. Extension directions (e.g., ED3 and ED4 in FIG. 18) of the third sub-groove 351 and the fourth sub-groove 352 are at an included angle less than 180 degrees and greater than 0 degree. Referring to FIG. 6, FIG. 17A, FIG. 17B, and FIG. 18, in a folded state of the pivotable support apparatus, the first shaft 440 is configured to be received in the second sub-groove 342, the second shaft 460 is configured to be received in the fourth sub-groove 352. Referring to FIG. 12, FIG. 17A, FIG. 17B, and FIG. 18, in an unfolded state of the pivotable support apparatus, the first shaft 440 is configured to be received in the first sub-groove 341, the second shaft 460 is configured to be received in the third sub-groove 351.

Referring to FIG. 14, the sliding plate fastener 13 in some embodiments includes a first fastening pin hole FH1 and a second fastening pin hole FH1. Referring to FIG. 4B, FIG. 14, FIG. 17A, and FIG. 17B, the third shaft 430 of the first sliding plate 13 is configured to be engaged with the first fastening pin hole FH1, thereby fixedly attaching the first slicing plate 13 to the sliding plate fastener 23; and the fourth shaft 450 of the second sliding plate 14 is configured to be engaged with the second fastening pin hole FH2, thereby fixedly attaching she second sliding plate 14 to the sliding plate fastener 23.

In another aspect, the present disclosure provides a display apparatus. In some embodiments, the display apparatus includes a folding display panel, and a pivotable support apparatus described herein. Optionally, the display panel is a liquid crystal display panel. Optionally, the display panel is an organic light emitting diode display panel. Optionally, the display panel is an electrophoretic display panel. Examples of appropriate display apparatuses include, but are not limited to, an electronic paper, a mobile phone, a tablet computer, a television, a monitor, a notebook computer, a digital album, a GPS, etc.

FIG. 7 is a perspective view of a display apparatus having a pivotable support apparatus in a folded state in some embodiments according to the present disclosure. Referring to FIG. 7, in the folded state of the display apparatus, the foldable display panel 100 has a cross-section having a tear-drop shape. A "tear drop shape" generally refers to a shape with two straight side portions diverging at an acute angle from a lower point and an arcuate upper portion extending between the upper ends of the side portions. In one example, a "Year-drop shape" is shaped like a drop of liquid having a globular form at one end and tapering to a point at the other end, or is shaped like a falling tear like a gem, as on an earring, necklace, or ring. By having this unique structure, the thickness of the display apparatus may be significantly reduced, and the local stress to the foldable display panel 100 can also be significantly reduced particularly when the display apparatus is in a folded state.

Referring to FIG. 7, in a folded state of the display apparatus, s third included angle β between a portion (P3 in FIG. 7) of the foldable display panel 100 in contact with the first sliding plate 13 and a portion (P4 in FIG. 7) of the foldable display panel 100 in contact with the second sliding plate 14 is greater than a fourth included angle between the portion (P1 in FIG. 7) of the foldable display panel 100 in contact with the first frame 203 and the portion (P2 in FIG. 7) of the foldable display panel 100 in contact with the second frame 204 (the fourth included angle in FIG. 7 is zero). In some embodiments, the fourth included angle is in a range of 0 degree to 10 degrees, e.g., 0 degree to 1 degrees, 1 degree to 2 degrees, 2 degree to 3 degrees, 3 degree to 4 degrees, 4 degree to 5 degrees, 5 degree to 6 degrees, 6 degree to 7 degrees, 7 degree to 8 degrees, 8 degree to 9 degrees, or 9 degree to 10 degrees. In some embodiments, the third included angle β is in a range of 10 degree to 75 degrees, e.g., 10 degree to 15 degrees, 15 degree to 10 degrees, 20 degree to 25 degrees, 25 degree to 30 degrees, 30 degree to 35 degrees, 35 degree to 40 degrees, 40 degree to 45 degrees, 45 degree to 50 degrees, 50 degree to 55 degrees, 55 degree to 60 degrees, 60 degree to 65 degrees, 65 degree to 70 degrees, or 70 degree to 75 degrees.

Referring to FIG. 7, m a folded state of the display apparatus, a thud included angle β between a portion (P3 in FIG. 7) of the foldable display panel 100 in contact with the first sliding plate 13 and a portion (P4 in FIG. 7) of the foldable display panel 100 in contact with the second sliding plate 14 is greater than a fifth included angle between the first frame 203 and the second frame 204 (the fifth included angle in FIG. 7 is zero). In some embodiments, the fifth included angle is in a range of 0 degree to 10 degrees, e.g., 0 degree to 1 degrees, 1 degree to 2 degrees, 2 degree to 3 degrees, 3 degree to 4 degrees, 4 degree to 5 degrees, 5 degree to 6 degrees, 6 degree to 7 degrees, 7 degree to & degrees, 8 degree to 9 degrees, or 9 degree to 10 degrees. In some embodiments, the third included angle β is in a range of 10 degree to 75 degrees, e.g., 10 degree to 15 degrees, 15 degree to 20 degrees, 20 degree to 25 degrees, 25 degree to 30 degrees, 30 degree to 35 degrees, 35 degree to 40 degrees, 40 degree to 45 degrees, 45 degree to 50 degrees, 50 degree to 55 degrees, 55 degree to 60 degrees, 60 degree to 65 degrees, 65 degree to 70 degrees, or 70 degree to 75 degrees.

In some embodiments, in a folded state of the pivotable support apparatus, the first sliding plate 13 and the second sliding plate 14 are spaced apart by a first distance d1 where they are connected to the sliding plate fastener 23, respectively. The first frame 203 and the second frame 204 are spaced apart by a third distance d3. Optionally, the first distance d1 is greater than the third distance d2. Optionally, a ratio of the first distance to the third distance is in a range of 3 to 100, e.g., 3 to 4, 4 to 5, 5 to 6, 6 to 7, 7 to 8, 8 to 9, 9 to 10, 10 to 12, 12 to 14, 14 to 16, 16 to 18, 18 to 20, 20 to 25, 25 to 30, 30 to 40, 40 to 50, 50 to 60, 60 to 70, 70 to 80, 80 to 90, or 90 to 100.

In some embodiments, the portion (P1 in FIG. 7) of the foldable display panel 100 is contact with the first frame 203 and the portion (P2 in FIG. 7) of the foldable display panel 100 in contact with the second frame 204 are spaced apart by a fourth distance d4. Optionally, the fast distance d1 is greater than the fourth distance d4. Optionally, the third distance d3 is greater than the fourth distance d4. Optionally, a ratio of the first distance d1 to the fourth distance d4 is in a range of 3 to 100, e.g., 3 to 4, 4 to 5, 5 to 6, 6 to 7, 7 to 8, 8 to 9, 9 to 10, 10 to 12, 12 to 14, 14 to 16, 16 to 18, 18 to 20, 20 to 25, 25 to 30, 30 to 40, 40 to 50, 50 to 60, 60 to 70, 70 to 80, 80 to 90, or 90 to 100.

In another aspect, the present invention provides a method of fabricating a pivotable support apparatus for supporting a foldable display panel. In some embodiments, the method includes forming a sliding groove structure; forming a first rotating rod and forming a second rotating rod, the first rotating rod and the second rotating rod slidably and rotatably attached to the sliding groove structure; forming a first rotating plate; forming a second rotating plate; forming a first connecting rod rotatably attached to the first rotating sod, and configured to move slidably relative to the first rotating plate; and forming a second connecting rod rotatably attached to the second rotating rod, and configured to move slidably relative to the second rotating plate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention" "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Suck terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pivotable support apparatus for supporting a foldable display panel, comprising:
a sliding groove structure;
a first rotating rod and a second rotating rod slidably and rotatably attached to the sliding groove structure;
a first rotating plate;
a second rotating plate;
a first connecting rod rotatably attached to the first rotating rod, and configured to move slidably relative to the first rotating plate; and
a second connecting rod rotatably attached to the second rotating rod, and configured to move slidably relative to the second rotating plate;
wherein the sliding groove structure comprises a first arc shaped groove and a second arc shaped groove;
the first rotating rod comprises a first arc shaped rod head configured to be movable slidably and rotatably in the first arc shaped groove; and
the second rotating rod comprises a second arc shaped rod head configured to be movable slidably and rotatably in the second arc shaped groove;
wherein the sliding groove structure comprises a first part and a second part fixedly attached to each other to form a first arc shaped groove and a second arc shaped groove;
the first part comprises a first arc shaped concave surface and a second arc shaped concave surface;
the first arc shaped rod head comprises a first arc shaped convex surface at least partially in contact with the first arc shaped concave surface; and
the second arc shaped rod head comprises a second arc shaped convex surface at least partially in contact with the second arc shaped concave surface.

2. The pivotable support apparatus of claim 1, further comprising a cladding board;
wherein the first part is fixedly attached to the cladding board.

3. The pivotable support apparatus of claim 1, further comprising:
a first retaining plate and a second retaining plate;
a first sliding slot between the first retaining plate and the first rotating plate, configured to allow the first connecting rod move slidably therein; and
a second sliding slot between the second retaining plate and the second rotating plate, configured to allow the second connecting rod move slidably therein.

4. The pivotable support apparatus of claim 1, further comprising a first frame and a second frame;
wherein the first connecting rod is fixedly attached to the first frame; and
the second connecting rod is fixedly attached to the second frame;
wherein the first frame and the first connecting rod are configured to move slidably relative to the first rotating plate; and
the second frame and the second connecting rod are configured to move slidably relative to the second rotating plate.

5. The pivotable support apparatus of claim 1, further comprising a first actuating rod and a second actuating rod;
wherein the first rotating plate is fixedly attached to the first actuating rod; and
the second rotating plate is fixedly attached to the second actuating rod.

6. The pivotable support apparatus of claim 1, further comprising:
a hinge structure comprising a first main shaft and a second main shaft; and
a synchronized gear configured to synchronize rotation of the first main shaft and the second main shaft;
wherein the synchronized gear comprises a first gear and a second gear configured to rotate about the first main shaft and the second main shaft, respectively; and
the first gear and the second gear are configured to be engaged with each other.

7. A display apparatus, comprising a foldable display panel and a pivotable support apparatus of claim 1.

8. The pivotable support apparatus of claim 3, wherein the first retaining plate is fixedly attached to the first rotating plate; and
the second retaining plate is fixedly attached to the second rotating plate.

9. The pivotable support apparatus of claim 6, further comprising a first actuating rod, a first crank shaft attached to the first actuating rod, a second actuating rod, and a second crank shaft attached to the second actuating rod;
wherein the first crank shaft comprises a third gear configured to be engaged with the first gear;
the second crank shaft comprises a fourth gear configured to be engaged with the second gear; and
movements of the first actuating rod, the first crank shaft, the second actuating rod, the second crank shaft are synchronized through engagement among the first gear, the second gear, the third gear, and the fourth gear.

10. A pivotable support apparatus for supporting a foldable display panel, comprising:
a sliding groove structure;
a first rotating rod and a second rotating rod slidably and rotatably attached to the sliding groove structure;
a first rotating plate;
a second rotating plate;
a first connecting rod rotatably attached to the first rotating rod, and configured to move slidably relative to the first rotating plate;
a second connecting rod rotatably attached to the second rotating rod, and configured to move slidably relative to the second rotating plate;
a first actuating rod;
a second actuating rod; and
a first crank shaft attached into a first pin hole in the first actuating rod and a second crank shaft attached into a second pin hole in the second actuating rod;
wherein the first rotating plate is fixedly attached to the first actuating rod; and
the second rotating plate is fixedly attached to the second actuating rod;
wherein the first crank shaft and the first actuating rod are configured to rotate together; and
the second crank shaft and the second actuating rod are configured to rotate together.

11. The pivotable support apparatus of claim 10, further comprising a damping slider configured to be resiliently pressing on the first crank shaft and the second crank shaft, providing damping resistance when the first crank shaft and the first actuating rod rotate relative to the second crank shaft and the second actuating rod.

12. The pivotable support apparatus of claim 11, wherein the first crank shaft comprises a first cam bar, the second crank shaft comprises a second cam bar;
the damping slider comprises a first notch, a second notch, a third notch, and a fourth notch;
in an unfolded state of the pivotable support apparatus, the first cam bar is configured to be engaged with the first notch, and the second cam bar is configured to be engaged with the second notch; and
in a folded state of the pivotable support apparatus, the first cam bar is configured to be engaged with the third notch, and the second cam bar is configured to be engaged with the fourth notch.

13. The pivotable support apparatus of claim 12, wherein the damping slider further comprises a first groove positioned between the first notch and the third notch, and a second groove positioned between the second notch and the fourth notch; and
during a movement between the folded state and the unfolded state of the pivotable support apparatus, the first cam bar is in contact with and gliding on a surface of the first groove, the second cam bar is in contact with and gliding on a surface of the second groove, thereby damping the movement of the pivotable support apparatus.

14. The pivotable support apparatus of claim 13, further comprising one or more springs configured to apply a force to the damping slider to maintain the damping slider in contact with the first cam bar and the second cam bar.

15. The pivotable support apparatus of claim 14, wherein the damping slider further comprises one or more spring shafts extending through the one or more springs, respectively; and
the pivotable support apparatus further comprises a fastener comprising one or more receiving holes configured to receive terminals of the one or more spring shafts, respectively.

16. A pivotable support apparatus for supporting a foldable display panel, comprising:
a sliding groove structure;
a first rotating rod and a second rotating rod slidably and rotatably attached to the sliding groove structure;
a first rotating plate;
a second rotating plate;
a first connecting rod rotatably attached to the first rotating rod, and configured to move slidably relative to the first rotating plate;
a second connecting rod rotatably attached to the second rotating rod, and configured to move slidably relative to the second rotating plate;
a sliding plate fastener;
a first actuating rod;
a second actuating rod;
a first sliding plate slidably attached to the first actuating rod; and
a second sliding plate slidably attached to the second actuating rod;
wherein the first sliding plate and the second sliding plate are fixedly attached to the sliding plate fastener; and
wherein, in a folded state of the pivotable support apparatus, a first included angle between the first sliding plate and the second sliding plate is greater than a second included angle between the first actuating rod and the second actuating rod.

17. The pivotable support apparatus of claim 16, wherein the first actuating rod comprises a first groove;
the second actuating rod comprises a second groove;
the first sliding plate comprises a first shaft configured to be received in the first groove, allowing the first sliding plate move slidably relative to the first actuating rod; and
the second sliding plate comprises a second shaft configured to be received in the second groove, allowing the second sliding plate move slidably relative to the second actuating rod.

18. The pivotable support apparatus of claim 16, wherein the sliding plate fastener comprises a first fastening pin hole and a second fastening pin hole;
the first sliding plate comprises a third shaft configured to be engaged with the first fastening pin hole; and
the second sliding plate comprises a fourth shaft configured to be engaged with the second fastening pin hole.

19. The pivotable support apparatus of claim 17, wherein the first groove comprises a first sub-groove and a second sub-groove connected with each other;
the second groove comprises a third sub-groove and a fourth sub-groove connected with each other;
extension directions of the first sub-groove and the second sub-groove are at an included angle less than 180 degrees and greater than 0 degree;
extension directions of the third sub-groove and the fourth sub-groove are at an included angle less than 180 degrees and greater than 0 degree; and
in a folded state of the pivotable support apparatus, the first shaft is configured to be received in the second sub-groove, the second shaft is configured to be received in the fourth sub-groove.

* * * * *